United States Patent
Shi et al.

(10) Patent No.: US 9,728,516 B2
(45) Date of Patent: Aug. 8, 2017

(54) ELECTRIC APPARATUS INCLUDING ELECTRIC PATTERNS FOR SUPPRESSING SOLDER BRIDGES

(71) Applicant: Samsung Electronics Co., Ltd., Suwon-si (KR)

(72) Inventors: Hongbin Shi, Hwaseong-si (KR); Kang Joon Lee, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/164,502

(22) Filed: May 25, 2016

(65) Prior Publication Data

US 2016/0351517 A1    Dec. 1, 2016

(30) Foreign Application Priority Data

May 29, 2015  (KR) .................. 10-2015-0076456

(51) Int. Cl.
*H01L 23/48* (2006.01)
*H01L 23/00* (2006.01)

(52) U.S. Cl.
CPC .............. *H01L 24/05* (2013.01); *H01L 24/06* (2013.01); *H01L 24/14* (2013.01); *H01L 2224/0401* (2013.01); *H01L 2224/05009* (2013.01); *H01L 2224/0615* (2013.01); *H01L 2224/13026* (2013.01); *H01L 2924/3841* (2013.01)

(58) Field of Classification Search
CPC .... H01L 23/48; H01L 23/4824; H01L 23/488
See application file for complete search history.

(56) References Cited

U.S. PATENT DOCUMENTS

| | | |
|---|---|---|
| 6,373,139 B1 | 4/2002 | Clark |
| 6,399,417 B1 | 6/2002 | Lee et al. |
| 7,112,880 B2 | 9/2006 | Cornelius et al. |
| 7,660,130 B2 | 2/2010 | Fujii |
| 8,273,994 B2 | 9/2012 | Reynov et al. |
| 8,525,042 B2 | 9/2013 | Abe et al. |
| 2007/0013083 A1* | 1/2007 | Kikuchi .............. H01L 21/4853 257/786 |
| 2009/0108448 A1 | 4/2009 | Lee |
| 2009/0154125 A1* | 6/2009 | Fujii .................... H01L 21/561 361/767 |
| 2013/0241683 A1 | 9/2013 | Tsai et al. |

FOREIGN PATENT DOCUMENTS

| | | |
|---|---|---|
| JP | H06-112635 A | 4/1994 |
| JP | H11-260962 A | 9/1999 |
| JP | 2007-059530 A | 3/2007 |
| JP | 2010-171140 A | 8/2010 |
| JP | 2011-096909 A | 5/2011 |
| KR | 10-2005-0081472 A | 8/2005 |

* cited by examiner

Primary Examiner — Jae Lee
(74) Attorney, Agent, or Firm — Muir Patent Law PLLC

(57) ABSTRACT

An electric apparatus may include a plurality of electric patterns arranged on a substrate. Each of the electric patterns may include a pad for connection with a solder ball, an electrical trace laterally extending from a portion of the pad to allow an electrical signal to be transmitted from or to the pad, a first dummy trace laterally extending from other portion of the pad, and a first connection line connecting the first dummy trace to the electrical trace. The first dummy trace may be provided at a position deviated from a straight line connecting the pad to the electrical trace.

18 Claims, 18 Drawing Sheets

ELECTRIC APPARATUS INCLUDING ELECTRIC PATTERNS FOR SUPPRESSING SOLDER BRIDGES

CROSS-REFERENCE TO RELATED APPLICATIONS

This U.S. non-provisional patent application claims priority under 35 U.S.C. §119 to Korean Patent Application No. 10-2015-0076456, filed on May 29, 2015, in the Korean Intellectual Property Office, the entire contents of which are hereby incorporated by reference.

BACKGROUND

Embodiments of the disclosure relate to an electric apparatus, and in particular, to an electric apparatus including an electric pattern capable of suppressing a solder bridge.

A solder ball is used as a part of a current path for transmitting electrical signals from or to an electric apparatus, such as a semiconductor chip or a semiconductor package. During a soldering process for forming the solder balls, a flow of a soldering material may create an electrical bridge between the solder balls. It is helpful to develop electric patterns capable of suppressing the bridge between the solder balls.

SUMMARY

Embodiments according to the present disclosure provide an electric apparatus including an electric pattern capable of suppressing a solder bridge issue.

In some exemplary embodiments, the present disclosure is directed to an electric apparatus comprising: plurality of electric patterns arranged on a substrate, each of the electric patterns comprising: a pad for connection with a solder ball; an electrical trace laterally extending from a first portion of the pad and configured to communicate an electrical signal with the pad; a first dummy trace laterally extending from a second portion of the pad; and a first connection line formed between the first dummy trace and the electrical trace and configured to communicate the electrical signal between the first dummy trace and the electrical trace, wherein the first dummy trace is offset from a straight line connecting the pad to the electrical trace.

In some aspects, the present disclosure may further include wherein the first dummy trace extends from the pad in a first direction and the electrical trace extends from the pad in a second direction that forms a right angle with the first direction.

In some aspects, the present disclosure may further include wherein each of the plurality of electric patterns further comprises a second dummy trace laterally extending from a third portion of the pad.

In some aspects, the present disclosure may further include wherein the second dummy trace extends from the pad along first line, wherein the electrical trace extends along the first line, and wherein the pad is interposed between the second dummy trace and the electrical trace.

In some aspects, the present disclosure may further include wherein each of the plurality of electric patterns further comprises a second connection line configured to electrically connect the second dummy trace to the electrical trace.

In some aspects, the present disclosure may further include wherein the second dummy trace and the first dummy trace extend from the pad in directions that are at right angles to each other.

In some aspects, the present disclosure may further include a solder mask layer provided on the substrate covering a portion of the electric pattern and including an opening exposing the pad, wherein the solder mask layer comprises: a first mask layer covering the electrical trace and the first dummy trace; and a second mask layer spaced apart from the electrical trace and the first dummy trace, wherein the first mask layer has a surface positioned at a higher level than a surface of the second mask layer.

In some aspects, the present disclosure may further include wherein the solder ball has a shape elongated toward the surface of the second mask layer.

In some aspects, the present disclosure may further include wherein an adjacent pair of the plurality of the electric patterns are provided in such a way that the electrical traces thereof face each other and form a symmetric arrangement.

In some aspects, the present disclosure may further include wherein the adjacent pair of the plurality of the electric patterns are provided in such a way that the first dummy traces thereof extend to opposite directions.

In some exemplary embodiments, the present disclosure is directed to an electric apparatus comprising: a plurality of electric patterns provided on a substrate; and a solder mask layer provided on the substrate covering the plurality of the electric patterns and including an opening exposing a portion of each of the plurality of the electric patterns, wherein a first electric pattern of the plurality of electric patterns comprises: a pad exposed by the opening and configured to connect to a solder ball; an electrical trace laterally extending from a first portion of the pad and configured to communicate an electrical signal with the pad; a first dummy trace laterally extending from a second portion of the pad; and a first connection line formed between the first dummy trace and the electrical trace and configured to communicate the electrical signal with the pad, wherein the first dummy trace is connected to the pad at a right angle with the electrical trace.

In some aspects, the present disclosure may further include wherein the electrical trace of the first electric pattern extends in a direction facing an electrical trace of a second electric pattern of the plurality of electric patterns.

In some aspects, the present disclosure may further include wherein the first dummy trace of the first electric pattern extends in a direction opposite to a first dummy trace of a second electric pattern of the plurality of the electric patterns.

In some aspects, the present disclosure may further include wherein the solder mask layer comprises: a first mask layer formed to cover the electrical trace and the first dummy trace; and a second mask layer formed to cover a portion of the pad and spaced apart from the electrical trace and the first dummy trace, wherein the first mask layer has a surface higher than the second mask layer.

In some aspects, the present disclosure may further include wherein each of the electric patterns further comprises: a second dummy trace laterally extending from a third portion of the pad, and wherein the second dummy trace is provided opposite the electrical trace with the pad interposed therebetween and is configured to connect to the pad to form a right angle with the first dummy trace.

In some aspects, the present disclosure may further include wherein the first electric pattern further comprises: a second connection line configured to electrically connect the first dummy trace to the second dummy trace.

In some aspects, the present disclosure may further include wherein the first electric pattern further comprises:

a third dummy trace laterally extending from a fourth portion of the pad, and wherein the third dummy trace is provided opposite the first dummy trace with the pad interposed therebetween and is configured to connect to the pad to form a right angle with each of the electrical trace and the second dummy trace.

In some aspects, the present disclosure may further include wherein the first electric pattern further comprises: at least one of a second connection line configured to electrically connect the first dummy trace to the second dummy trace, a third connection line configured to electrically connect the second dummy trace to the third dummy trace, or a fourth connection line configured to electrically connect the third dummy trace to the electrical trace.

In some exemplary embodiments, the present disclosure is directed to an electric apparatus comprising: a plurality of electric patterns arranged in rows and columns on a substrate, each of the electric patterns comprising: a pad for connection with a solder ball, wherein the solder ball has a shape that, with respect to a top down view, is elongated in a direction at an acute angle to the rows and the columns; an electrical trace laterally extending from a first portion of the pad and configured to communicate an electrical signal with the pad; a first dummy trace laterally extending from a second portion of the pad; a first connection line formed between the first dummy trace and the electrical trace and configured to communicate the electrical signal between the first dummy trace and the electrical trace; a second dummy trace laterally extending from a third portion of the pad; and a second connection line extending from the second dummy trace and configured to communicate the electrical signal between the electrical trace and the second dummy trace.

In some aspects, the present disclosure may further include wherein the second connection line is formed between the second dummy trace and the electrical trace and communicates the electrical signal between the second dummy trace and the electrical trace.

In some aspects, the present disclosure may further include wherein the second connection line is formed between the second dummy trace and the first dummy trace and communicates the electrical signal between the second dummy trace and the first dummy trace According to some aspects of the disclosed concepts, an electric apparatus with electric patterns may be configured in such a way that a soldering material can be flowed to a specific direction, allowing for prevention of a bridge phenomenon between the electric patterns.

According to other aspects of the disclosed concepts, a dummy trace may be provided at a side of a solder pad, and this may allow a soldering material to be flowed to a desired direction.

According to example embodiments of the disclosed concepts, an electric apparatus may include a plurality of electric patterns arranged on a substrate. Each of the electric patterns may include a pad for connection with a solder ball, an electrical trace laterally extending from a portion of the pad to allow an electrical signal to be transmitted from or to the pad, a first dummy trace laterally extending from other portion of the pad, and a first connection line connecting the first dummy trace to the electrical trace. The first dummy trace may be provided at a position deviated from a straight line connecting the pad to the electrical trace.

In some embodiments, the first dummy trace and the electrical trace may be connected to the pad to form a right angle.

In some embodiments, each of the electric patterns may further include a second dummy trace laterally extending from still other portion of the pad.

In some embodiments, the second dummy trace may be provided on the straight line to face the electrical trace with the pad interposed therebetween.

In some embodiments, each of the electric patterns may further include a second connection line electrically connecting the second dummy trace to the electrical trace.

In some embodiments, the second dummy trace may be disposed to form a right angle with the first dummy trace.

In some embodiments, the electric apparatus may further include a solder mask layer, which is provided on the substrate to cover a portion of the electric pattern and has an opening exposing the pad. The solder mask layer may include a first mask layer covering the electrical trace and the first dummy trace, and a second mask layer spaced apart from the electrical trace and the first dummy trace. The first mask layer may have a surface positioned at a higher level than a surface of the second mask layer.

In some embodiments, the solder ball may have a shape elongated toward the surface of the second mask layer rather than toward the surface of the first mask layer.

In some embodiments, an adjacent pair of the electric patterns may be provided in such a way that the electrical traces thereof face each other and form a symmetric arrangement.

In some embodiments, the adjacent pair of the electric patterns may be provided in such a way that the first dummy traces thereof extend to opposite directions.

According to certain example embodiments, an electric apparatus may include a plurality of electric patterns, which are provided on a substrate, and a solder mask layer, which is provided on the substrate to cover the electric pattern and has an opening exposing a portion of each of the electric patterns. Each of the electric patterns may include a pad exposed by the opening and connected to a solder ball, an electrical trace laterally extending from a portion of the pad to allow an electrical signal to be transmitted from or to the pad, a first dummy trace laterally extending from other portion of the pad, and a first connection line connecting the first dummy trace to the electrical trace. The first dummy trace may be connected to the pad to form a right angle with the electrical trace.

In some embodiments, the electric patterns may be provided in such a way that the electrical traces thereof face each other and form a symmetric arrangement.

In some embodiments, the electric patterns may be provided in such a way that the first dummy traces thereof extend to opposite directions.

In some embodiments, the solder mask layer may include a first mask layer provided to cover the electrical trace and the first dummy trace, and a second mask layer provided to cover a portion of the pad and spaced apart from the electrical trace and the first dummy trace. The first mask layer may have a surface lower than the second mask layer.

In some embodiments, each of the electric patterns may further include a second dummy trace laterally extending from still other portion of the pad. The second dummy trace may be provided to face the electrical trace with the pad interposed therebetween and may be connected to the pad to form a right angle with the first dummy trace.

In some embodiments, each of the electric patterns may further include a second connection line connecting the first dummy trace to the second dummy trace.

In some embodiments, each of the electric patterns may further include a third dummy trace laterally extending from even other portion of the pad. The third dummy trace may be provided to face the first dummy trace with the pad interposed therebetween and may be connected to the pad to form a right angle with each of the electrical trace and the second dummy trace.

In some embodiments, each of the electric patterns may further include at least one of a second connection line connecting the first dummy trace to the second dummy trace, a third connection line connecting the second dummy trace to the third dummy trace, or a fourth connection line connecting the third dummy trace to the electrical trace.

In some embodiments, the electric patterns may be regularly or randomly arranged on the substrate.

In some embodiments, the electric patterns may be locally arranged on the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
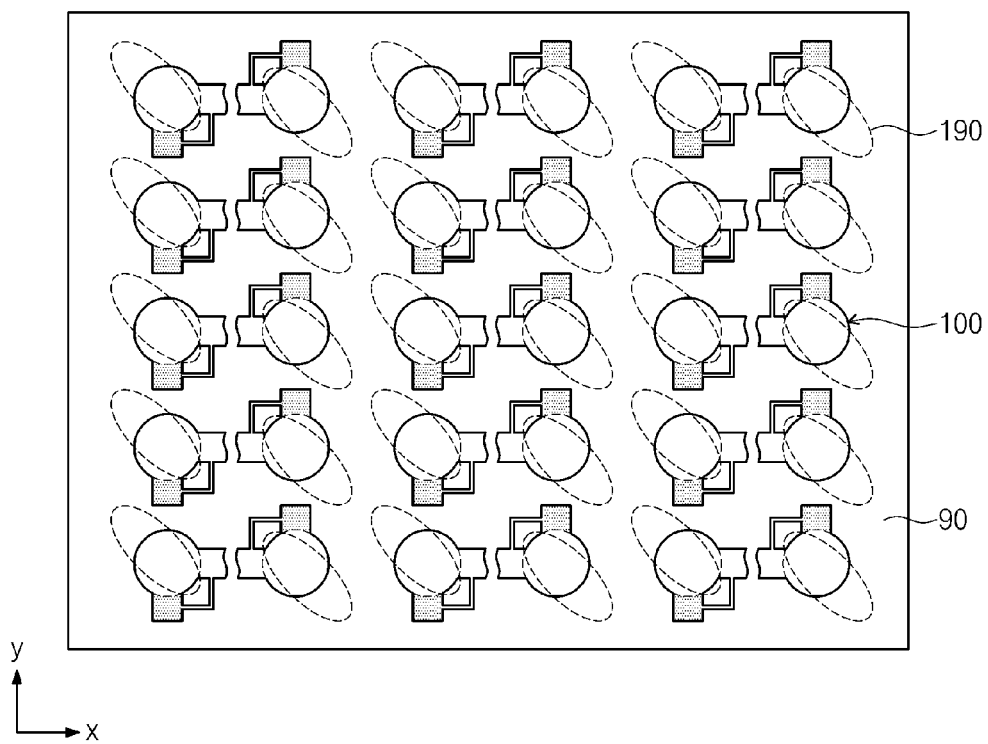
FIG. 1A is a plan view illustrating an electric apparatus, according to certain example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein. In the drawings, the thicknesses of layers and regions are exaggerated for clarity. Unless otherwise noted, like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that spatially relative terms are intended to encompass different orientations of the device in use or operation in addition to the orientation depicted in the figures. For example, if the device in the figures is turned over, element(s) or feature(s) described as "below," "beneath," or "under" another/other element(s) or feature(s) would then be oriented "above" or "on top of" the another/other element(s) or feature(s). Thus, the exemplary terms "below," "beneath," or "under" can encompass both an orientation of above and below. The device may be otherwise oriented (rotated 90 degrees or at other orientations) and the spatially relative descriptors used herein interpreted accordingly. Also these spatially relative terms such as "above" and "below" as used herein have their ordinary broad meanings—for example element A can be above element B even if when looking down on the two elements there is no overlap between them (just as something in the sky is generally above something on the ground, even if it is not directly above). In addition, it will also be understood that when a layer is referred to as being "between" two layers, it can be the only layer between the two layers, or one or more intervening layers may also be present.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

The exemplary embodiments will be described with reference to cross-sectional views and/or plan views, which are ideal exemplary views. Thicknesses of layers and areas are exaggerated for effective description of the technical contents in the drawings. Forms of the embodiments may be modified by the manufacturing technology and/or tolerance. Therefore, the disclosed embodiments are not intended to be limited to illustrated specific forms, and may include modifications of forms generated according to manufacturing processes. For example, an etching area illustrated at a right angle may be round or have a predetermined curvature. Therefore, areas illustrated in the drawings have overview properties, and shapes of the areas are illustrated special forms of the areas of a device, and are not intended to be limited to the scope of the disclosed embodiments.

The terminology used herein is for the purpose of describing particular embodiments only and is not intended to be limited to the exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements components, and/or groups, but do not preclude the presence or addition of one or more other features, integers, steps, operations, elements, components, and/or groups. In addition, unless the context indicates otherwise, steps described in a particular order need not occur in that order.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" or as "contacting" another element or layer, there are no intervening elements or layers present.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
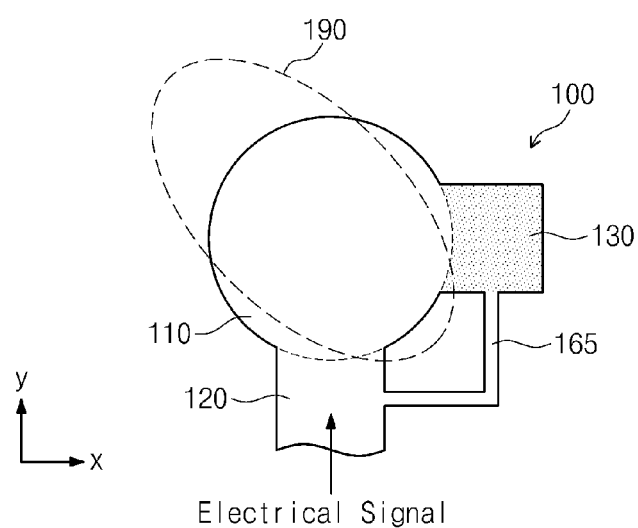
FIGS. 1B and 1C are plan views illustrating electric patterns provided in an electric apparatus, according to certain example embodiments.
Figure 1C:
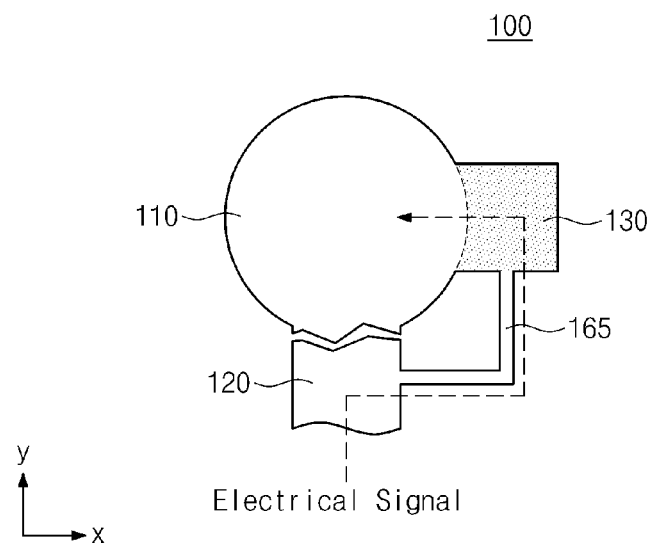
Figure 1D:
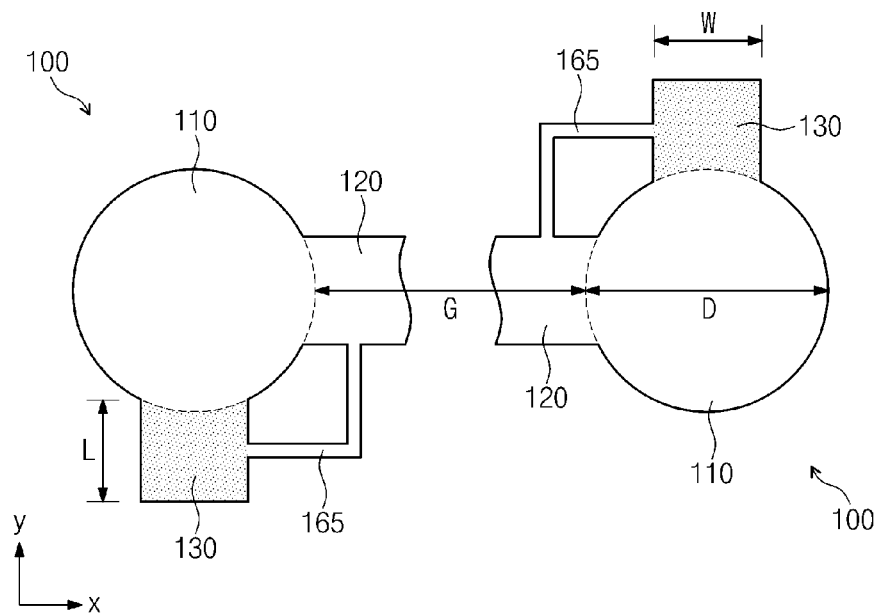
FIG. 1D is a plan view illustrating an arrangement of electric patterns provided in an electric apparatus, according to certain example embodiments.

FIG. 1A is a plan view illustrating an electric apparatus according to certain example embodiments. FIGS. 1B and 1C are plan views illustrating electric patterns provided in an electric apparatus according to certain example embodiments. FIG. 1D is a plan view illustrating an arrangement of electric patterns provided in an electric apparatus according to certain example embodiments.

Referring to FIG. 1A, an electric apparatus 1 may include a plurality of electric patterns 100 formed on a substrate 90. The substrate 90 may include a silicon wafer, a module substrate, a printed circuit board, or the like. The electric pattern 100 may be a bonding pad, to which a solder ball 190 is connected. Solder ball 190 may be a tiny globe of solder that provides contact between the chip package and the printed circuit board (PCB). Although certain embodiments describe the solder 190 as a ball, it will be understood that reference to a "ball" does not require any particular geometry (e.g., spherical). The electric patterns 100 may be regularly or randomly arranged on the substrate 90. The electric patterns 100 may be arranged on the entire region or a local region of the substrate 90. In this example, the electric patterns 100 are regularly spaced apart (e.g., at the same pitch) to form rows and columns respectively extending in the X- and Y-directions. The electric patterns 100 are formed throughout a rectangular region (that may be a square) that has borders extending in the row and column directions of the array of electric patterns (here in the X- and Y-directions). As solder balls 190 are formed with the electric patterns 100, the group of solder balls 190 form a ball grid array with the same pitch, and row and column directions of the electric patterns 100 as described herein and a repetitive description is thus omitted.

Referring to FIG. 1B, the electric pattern 100 may include a solder pad 110, an electrical trace 120, and a dummy trace 130. The electric trace 120 may extend between the solder pad 110 and a conductive terminal (such as a chip pad, a package pad, a solder ball, a through substrate via—not shown) to transmit an electrical signal (e.g., power or an information signal, such as a data signal, address signal or command signal) between the solder pad 110 and the conductive terminal as part of transmitting that electrical signal between a semiconductor device of the electric apparatus 1 and a source external to the electric apparatus 1 and/or another semiconductor device of the electric apparatus. Other than by a possible connection to the electric trace 120 (e.g., by virtue of connection line 165), dummy trace 130 may not be used to transmit an electrical signal between the solder pad 110 and another device. The only conductive elements the dummy trace 130 may be directly connected to may comprise the solder pad 110 and a connection line (or lines) connecting the dummy trace 130 to the electrical trace 120. In some examples, the solder pad 110 may be the only conductive element to which the dummy trace 130 is directly connected. The solder ball 190 may be connected to the solder pad 110. The solder ball 190 may be connected to the solder pad 110 through a soldering process. The electrical trace 120 may extend laterally from a portion of the solder pad 110 and allow an electrical signal (depicted by a solid arrow) to be transmitted from or to the solder pad 110.

The dummy trace 130 may extend laterally from another portion of the solder pad 110. In example embodiments, the electrical trace 120 may be provided to be substantially perpendicular to the dummy trace 130. For example, as illustrated in the example of FIG. 1B, the electrical trace 120 may extend in a first direction (e.g., opposite Y-direction) and the dummy trace 130 may extend in a second direction (e.g., X-direction), and thus, the traces 120 and 130 may be formed at a right angle. In some embodiments, the electrical trace 120 may be longer than the dummy trace 130. The electrical trace 120 may linearly or non-linearly extend away from the solder pad 110. The solder ball 190 coupled to the electrical trace 120 may be electrically connected to other semiconductor devices and/or packages.

In some embodiments, the electrical trace 120 and the dummy trace 130 may be electrically connected to each other by a connection line 165. Accordingly, as illustrated in FIG. 1C, if the electrical trace 120 is disconnected or electrically separated from the solder pad 110, an electrical signal (depicted by a dotted arrow) can be transmitted from the electrical trace 120 to the solder pad 110 through the connection line 165 and the dummy trace 130.

FIG. 1D illustrates two adjacent electric patterns 100 (i.e., adjacent pair of electric patterns 100) of, for example, the electric apparatus 1 of FIG. 1A. Referring to FIG. 1D, at least one of the adjacent pairs of the electric patterns 100 may be arranged to have symmetry (e.g., rotational symmetry or point symmetry). For example, an adjacent pair of the electric patterns 100 may be provided in such a way that the electrical traces 120 of each of the electric patterns 100 face each other, but the dummy traces 130 of the electric patterns 100 are oriented to extend in opposite directions (e.g., Y-direction or opposite Y-direction with respect to the corresponding solder pad 110 to which the respective dummy trace 130 is connected). Electrical traces 120 of the adjacent pair of electric patterns 100 may extend along a common axis (e.g., X-direction), whereas a first dummy trace 130 of the adjacent pair of electric patterns 100 may extend in a second direction (e.g., Y-direction) and a second dummy trace 130 of the adjacent pair of electric patterns 100 may extend opposite to the second direction (e.g., opposite Y-direction) at different points along the X-axis.

In the example where the solder pad 110 has a circular shape, a width W in the X-direction of the dummy trace 130 may be greater than about 20% of a diameter D of the solder pad 110. In some embodiments, the width W may be between 0.2*D and 0.8*D. A length L in the Y-direction of the dummy trace 130 may be greater than about 20% of a space G between an adjacent pair of the solder pads 110. In some embodiments, the length L may be between 0.2*G and 0.8*G. A width (i.e., the dimension in the vertical direction in FIG. 1D) of the electrical trace 120 may be the same as or similar to the width W in the X-direction of the dummy trace 130. A length (i.e., the dimension in the horizontal direction in FIG. 1D) of the electrical trace 120 may be the same as or similar to the length L (in the X-direction) of the dummy trace 130.

Figure 2:
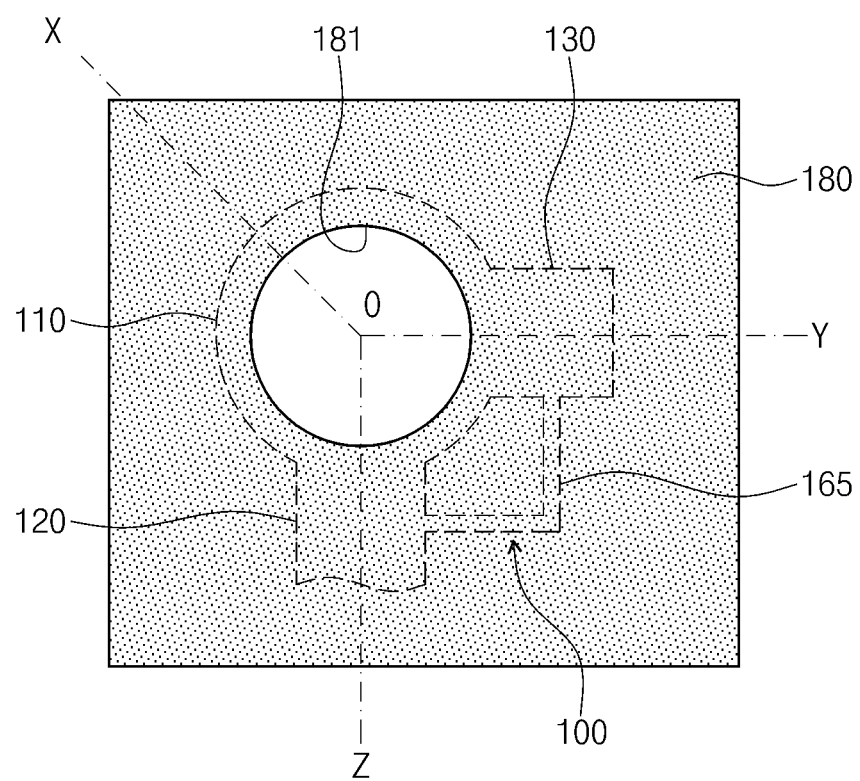
FIG. 2 is a plan view illustrating a portion of FIG. 1A, according to certain exemplary embodiments.
Figure 3A:
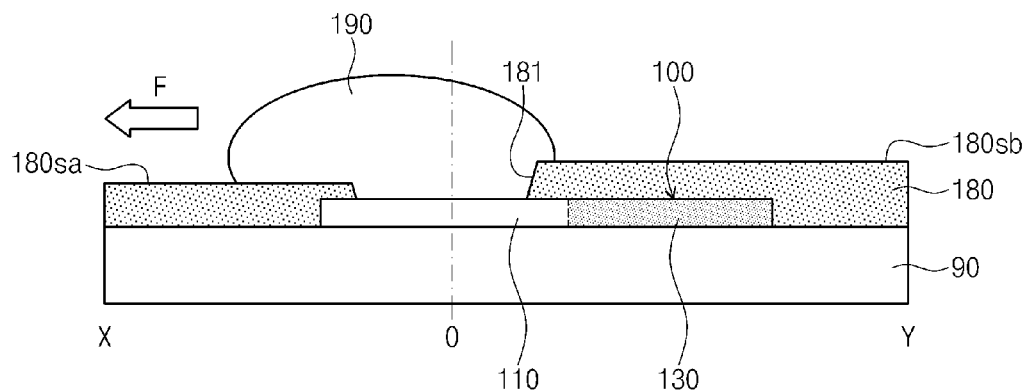
FIG. 3A is a sectional view taken along line X-O-Y of FIG. 2, according to certain exemplary embodiments.
Figure 3B:
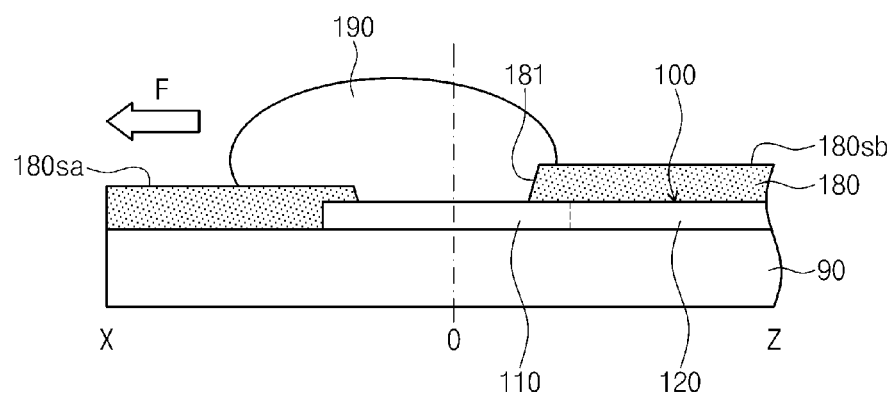
FIG. 3B is a sectional view taken along line X-O-Z of FIG. 2, according to certain exemplary embodiments.
Figure 4A:
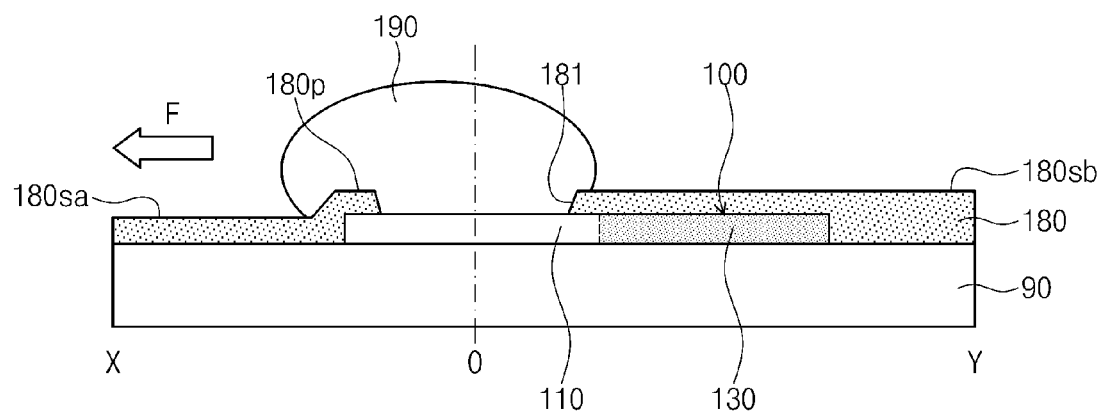
FIG. 4A is a sectional view illustrating modifications of the disclosure of FIG. 3A, according to certain exemplary embodiments.
Figure 4B:
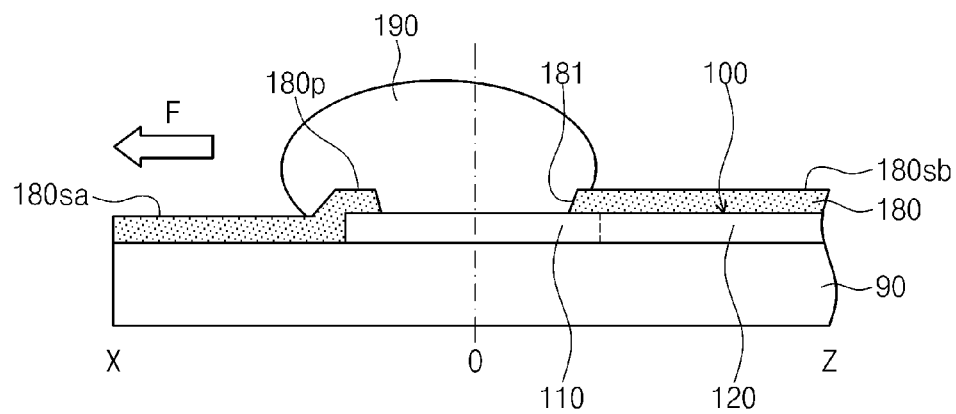
FIG. 4B is a sectional view illustrating modifications of the disclosure of FIG. 3B, according to certain exemplary embodiments.

FIG. 2 is a plan view illustrating a portion of FIG. 1A, consistent with certain exemplary embodiments. FIG. 3A is a sectional view taken along line X-O-Y of FIG. 2. FIG. 3B is a sectional view taken along line X-O-Z of FIG. 2. FIG. 4A is a sectional view illustrating a variation of the exemplary embodiment illustrated in FIG. 3A. FIG. 4B is a sectional view illustrating a variation of the exemplary embodiment illustrated in FIG. 3B.

Referring to FIG. 2, a solder mask layer 180 may be formed on the electric pattern 100 (illustrated by the dashed lines) to define a position for connection with a solder ball. The solder mask layer 180 may include an opening 181 whose area is smaller than that of the solder pad 110. Thus, the opening 181 may be formed to exposing a portion of the solder pad 110, while not allowing any of the electrical trace 120 and the dummy trace 130 to be exposed. As shown in FIG. 2, opening 181 may be centered over solder pad 110 at center point O.

Referring to FIGS. 3A and 3B, the solder mask layer 180 may have upper surfaces 180sa and 180sb positioned at different levels or relative surface heights. For example, the solder mask layer 180 may include a first portion, which does not cover the dummy trace 130 (as illustrated in FIG. 3A) and the electrical trace 120 (as illustrated in FIG. 3B) and has a first surface 180sa, and the solder mask layer 180 may include a second portion, which does cover the dummy trace 130 (as illustrated in FIG. 3A) and the electrical trace 120 (as illustrated in FIG. 3B) and has a second surface 180sb. In the embodiment illustrated in FIGS. 3A and 3B, the second surface 180sb may be positioned at a higher level than the first surface 180sa. Due to the difference in level or relative surface heights between the first and second surfaces 180sa and 180sb, when a soldering process is performed, a liquid soldering material may flow from the second surface 180sb toward the first surface 180sa of the solder mask layer 180 (e.g., toward a direction F that is parallel to line O-X). As a result, the solder ball 190 may have a shape elongated toward the direction F or parallel to the line O-X. With respect to a top down view, the shape of the boundary of the solder ball 190 may change from a circular or rounded shape to an elliptical or other elongated shape due to the gravitational flow of the liquid soldering material from the relatively higher second surface 180sb to the relatively lower first surface 180sa. The solder ball 190 may thus have a length larger than its width with respect to a top down view (as shown in FIGS. 1A and 1B). An exemplary method of forming the solder mask layer 180 having the surfaces 180sa and 180sb will be described with reference to FIGS. 10A through 10G.

As shown in FIGS. 1A and 1B, for example, the solder ball 190 may have a shape that is elongated toward a region in which the electrical trace 120 and the dummy trace 130 are not formed (e.g., in a direction of the line O-X of FIG. 2). As shown in FIG. 1A, the solder balls 190 may extend at an acute angle with respect the X- and Y-directions, such as between 30 to 60 degrees with respect to the X-direction and/or Y-direction (in this example, at about 45 degrees with respect to both the X-direction and the Y-direction). Since the adjacent ones of the electric patterns 100 may be arranged in a rotationally symmetric manner, as described previously with reference to FIG. 1D, the solder ball 190 may have a slantingly elongated shape, as shown in FIG. 1A. Accordingly, it may be possible to suppress or prevent a bridge between the solder balls 190 of adjacent electric patterns 100. As used herein, the terms "bridge" and "solder bridge" refer to the phenomenon of electrical shorts that can occur between adjacent solder balls 190 as a result of previously separate solder material that comes too near or close to one another as a result of, for example, a flow of liquid solder material.

In some embodiments, as shown in FIGS. 4A and 4B, for example, the solder mask layer 180 may include a protrusion 180$p$ which is formed on an edge of the solder pad 110 and spaced apart from the dummy trace 130 and the electrical trace 120. The protrusion 180$p$ may have a top surface whose level is higher than that of the first surface 180$sa$ and substantially the same as or similar to that of the second surface 180$sb$. In some embodiments, the protrusion 180$p$ may gradually decline in height from its top surface to the relatively lower first surface 180$sa$. For example, the protrusion 180$p$ may transition from a level similar to that of the second surface 180$sb$ to the level of the first surface 180$sa$. The protrusion 180$p$ may have a relatively small length or area, when compared to the portion of the solder mask layer 180 covering the dummy trace 130 or the electrical trace 120, and thus, it is likely that a liquid soldering material will flow toward the direction F parallel to the line O-X. The size or area of protrusion 180$p$ may be such that the solder ball 190, when having a circular or globular shape, may reach the edge of, or overlap, protrusion 180$p$. Accordingly, as shown in FIG. 1B, the solder ball 190 may have a shape elongated toward the region in which the electrical trace 120 and the dummy trace 130 are not formed. For example, the shape of solder ball 190 may change from a circular or globular shape to an elliptical or elongated shape due to the gravitational flow of the liquid soldering material from the relatively higher surface of protrusion 180$p$ to the relatively lower first surface 180$sa$.

Figure 5:
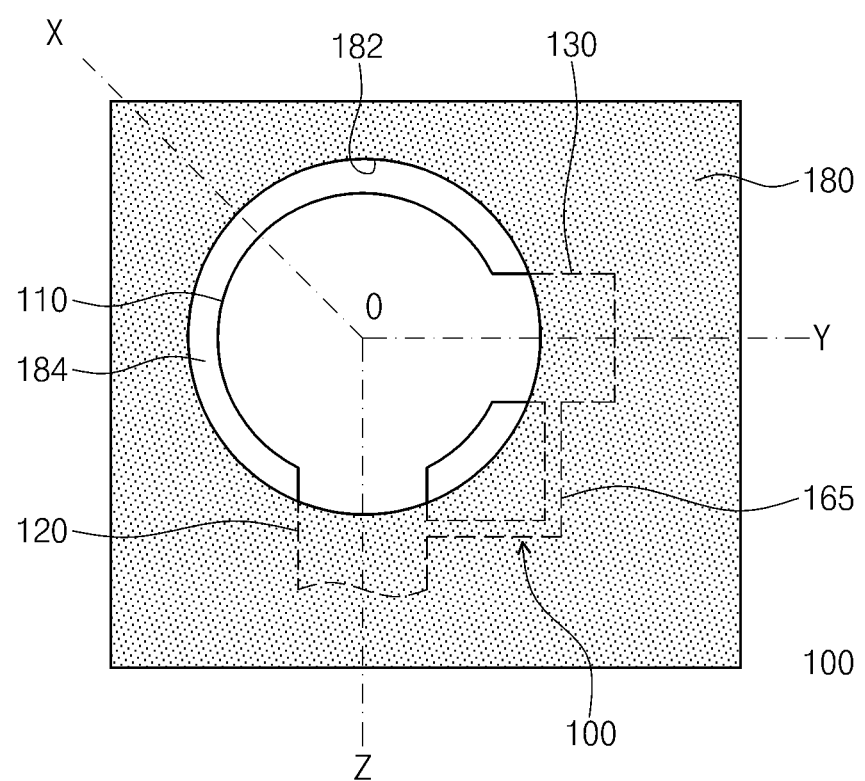
FIG. 5 is a plan view illustrating a portion of the exemplary embodiments of FIG. 1A.
Figure 6A:
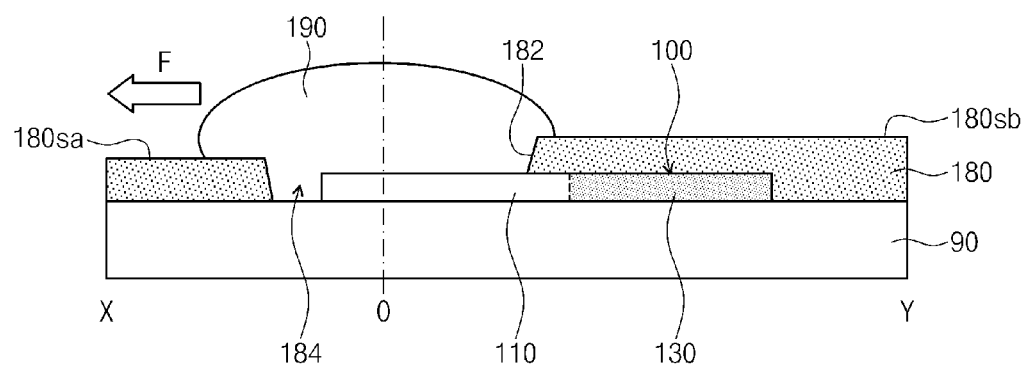
FIG. 6A is a sectional view taken along line X-O-Y of FIG. 5, according to certain exemplary embodiments.

FIG. 5 is a plan view illustrating a portion of FIG. 1A, according to certain example embodiments. FIG. 6A is a sectional view taken along line X-O-Y of the exemplary embodiment of FIG. 5, and FIG. 6B is a sectional view taken along line X-O-Z of the exemplary embodiment of FIG. 5.

Referring to FIG. 5, the solder mask layer 180 may be formed on the electric pattern 100 to define a region for connection with a solder ball. The solder mask layer 180 may have an opening 182 whose area is greater than that of the solder pad 110. The opening 182 may be formed to completely expose the solder pad 110 and partially expose the electrical trace 120 and the dummy trace 130. In some embodiments, opening 182 may be formed to partially expose the same or similar area sizes of the electrical trace 120 and the dummy trace 130. As shown in FIG. 5, opening 182 may be centered over solder pad 110 at center point O.

Figure 6B:
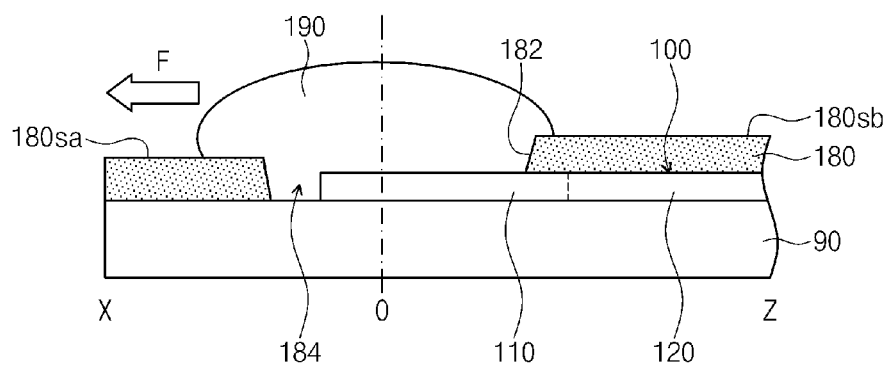
FIG. 6B is a sectional view taken along line X-O-Z of FIG. 5, according to certain exemplary embodiments.

Referring to FIGS. 6A and 6B, the first surface 180$sa$ of the solder mask layer 180, which may be located away or spaced apart from the dummy trace 130 and the electrical trace 120, may have a lower level than the second surface 180$sb$ of the solder mask layer 180, which may cover the dummy trace 130 and the electrical trace 120. For example, in the embodiment illustrated in FIGS. 6A and 6B, the second surface 180$sb$ may be positioned at a relatively higher vertical surface level than that of the first surface 180$sa$. Since the opening 182 has a larger area than the solder pad 110, the solder mask layer 180 may be spaced apart from the solder pad 110 near the first surface 180$sa$ to form an empty space or gap 184 between the solder pad 110 and the solder mask layer 180. For instance, because the size of the opening 182 is larger area than the solder pad 110, there may be a gap 184 between the solder pad 110 and the solder mask layer 180. Thus, it is likely that a liquid soldering material will flow toward the direction F parallel to the line O-X when a soldering process is performed. For instance, with respect to a top down view, the shape of the boundary of the solder ball 190 may change from a circular or rounded shape to an elliptical or elongated shape due to the gravitational flow of the liquid soldering material from the relatively higher second surface 180$sb$ to the relatively lower first surface 180$sa$, as well as from the gravitational forces caused by the gap 184.

Accordingly, as shown in FIGS. 1A and 1B, for example, the solder ball 190 may have a shape that is elongated toward the region in which the electrical trace 120 and the dummy trace 130 are not formed (i.e., in a direction of the line O-X of FIG. 5). The solder mask layer 180 may be formed by the same or similar process as described with reference to FIGS. 10A through 10G.

Figure 7A:
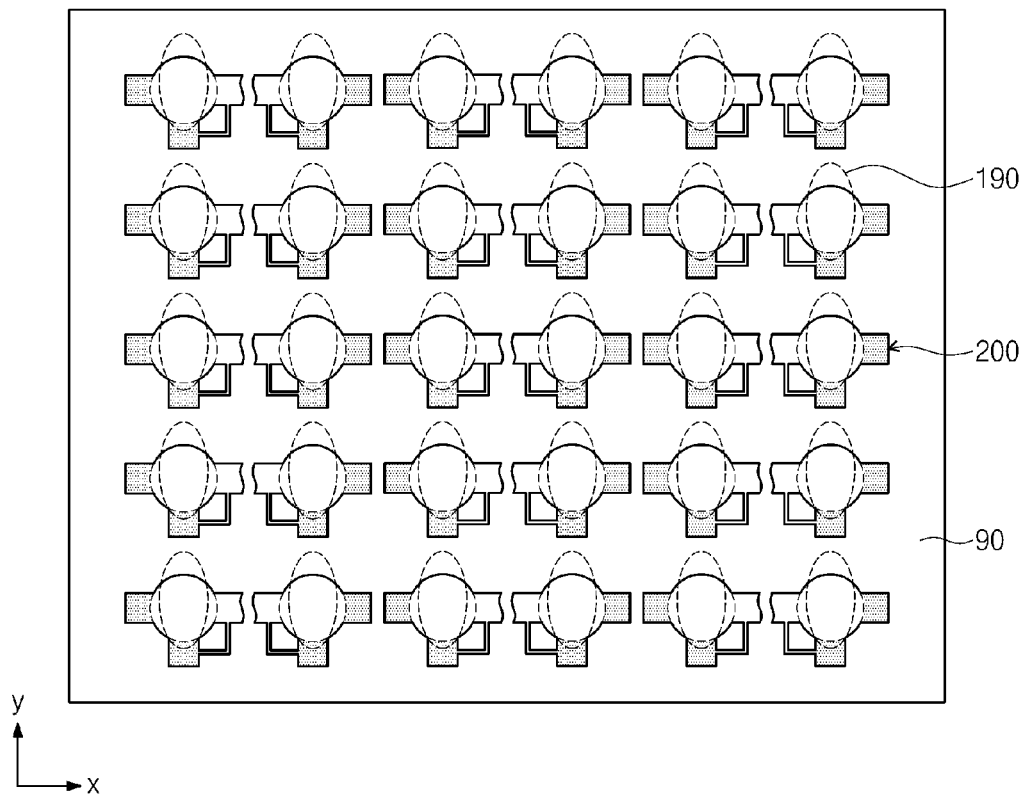
FIG. 7A is a plan view illustrating an electric apparatus, according to certain example embodiments.
Figure 7B:
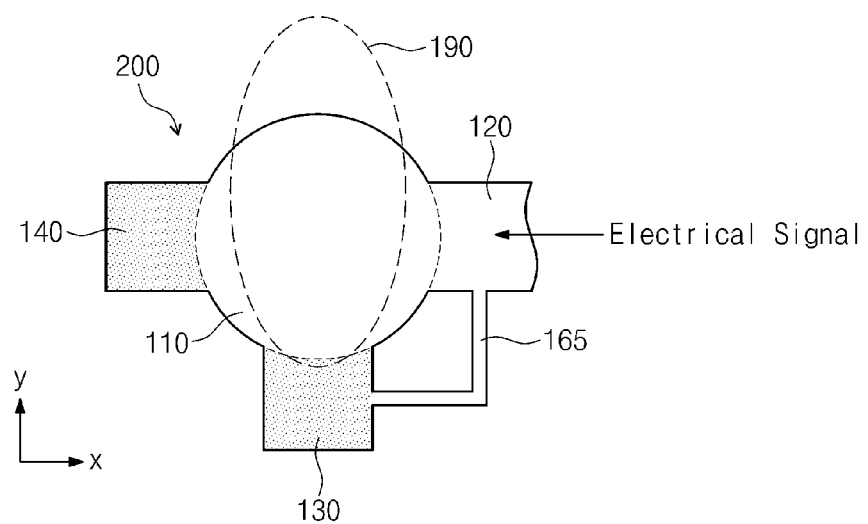
FIG. 7B is a plan view illustrating electric patterns provided in an electric apparatus, according to certain example embodiments.
Figure 7C:
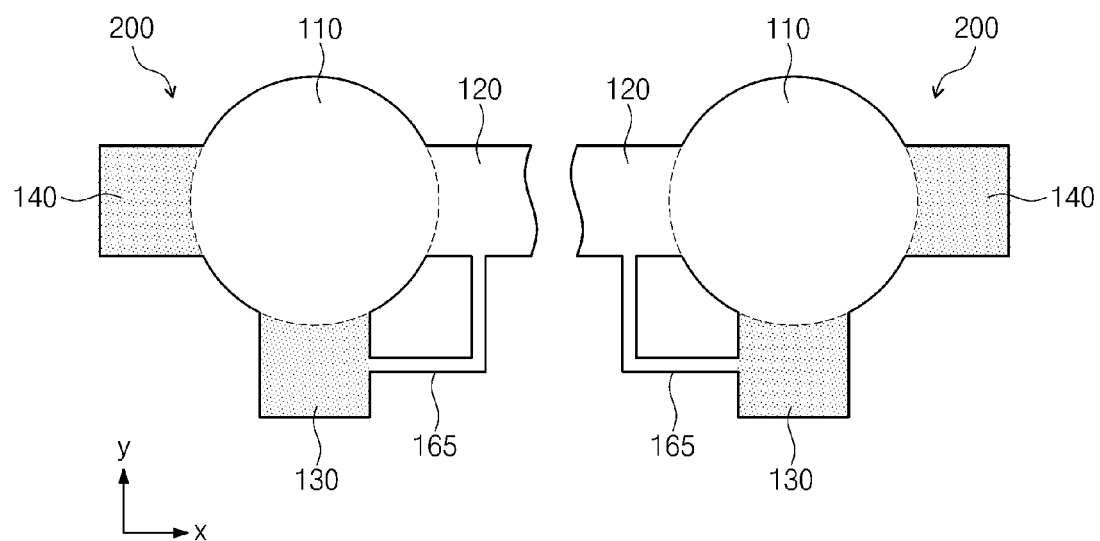
FIG. 7C is a plan view illustrating an arrangement of electric patterns provided in an electric apparatus, according to certain example embodiments.
Figure 7D:
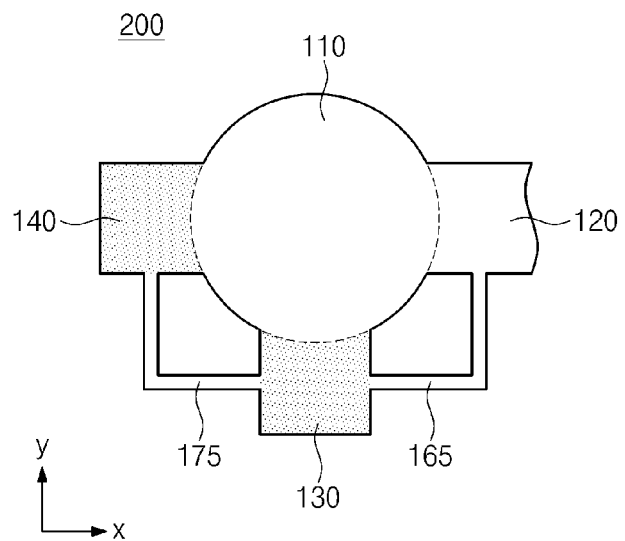
FIG. 7D is a plan view illustrating modifications of the disclosure of FIG. 7B, according to certain exemplary embodiments.

FIG. 7A is a plan view illustrating an electric apparatus according to certain example embodiments. FIG. 7B is a plan view illustrating electric patterns provided in an electric apparatus according to certain example embodiments. FIG. 7C is a plan view illustrating an arrangement of electric patterns provided in an electric apparatus according to certain example embodiments. FIG. 7D is a plan view illustrating a variation of the example embodiments shown in FIG. 7B.

Referring to FIG. 7A, an electric apparatus 2 may include a plurality of electric patterns 200 regularly or randomly arranged on the substrate 90. In the example of FIG. 7A, the plurality of electric patterns 200 are arranged in rows and columns respectively extending in the X- and Y-directions. Each of the electric patterns 200 may be a bonding pad to which the solder ball 190 is connected. The electric patterns 200 may be arranged regularly throughout the entire region or a local region of the substrate 90. Such region may be rectangular (including square) and have upper and lower borders (with respect to FIG. 7A) extending in the X direction and right and left borders (with respect to FIG. 7A) extending in the Y direction.

Referring to FIG. 7B, the electric pattern 200 may include a solder pad 110 to which the solder ball 190 is connected, an electrical trace 120 that extends laterally from a portion of the solder pad 110 in a first direction (e.g., X-direction), and two dummy traces 130 and 140 that extend laterally from other portions of the solder pad 110 in second and third directions (e.g., opposite Y-direction and opposite X-direction). The electrical trace 120 and the dummy traces 130 and 140 may be provided to be perpendicular to one other and thereby to form right angles. For example, as illustrated in the example of FIG. 7B, the electrical trace 120 may extend in the first direction (e.g., X-direction), the first dummy trace 130 may extend in the second direction (e.g., opposite Y-direction), and the second dummy trace 140 may extend in the third direction (e.g., opposite X-direction). The electrical trace 120 and the first dummy trace 130 may be electrically connected to each other by the connection line 165. Thus, if the electrical trace 120 is disconnected or electrically separated from the solder pad 110, an electrical signal can be transmitted from the electrical trace 120 to the solder pad 110 through the connection line 165 and the dummy trace 130.

When a soldering process is performed in embodiments such as those disclosed in FIGS. 7A-7D, it is likely that a liquefied solder ball will flow toward a region in which the electrical trace 120 and the dummy traces 130 and 140 are not provided (e.g., Y-direction). Accordingly, as illustrated in FIG. 7A, it may be possible to prevent or reduce the risk of a bridge forming between the solder balls 190 of electric patterns 100.

FIG. 7C illustrates two adjacent electric patterns 200 (i.e., adjacent pair of electric patterns 200) of, for example, the electric apparatus 2 of FIG. 7A. Referring to FIG. 7C, at least one of the adjacent pairs of the electric patterns 200 may be arranged to have symmetry (e.g., mirror symmetry). For example, in an adjacent pair of the electric patterns 200, the electrical traces 120 of each of the electric patterns 200 may be provided to face or mirror each other along a common axis (e.g., X-axis), the first dummy traces 130 of the electric patterns 200 may be oriented toward a downward direction (e.g., opposite Y-direction), and the second dummy traces 140 of the electric patterns 200 may be oriented toward respective left and right directions (e.g., opposite X-direction and X-direction, respectively). For instance, electrical traces 120 of the adjacent pair of electric patterns 200 may extend in opposite directions and face one another (e.g., X-direction and opposite X-direction), the first dummy traces 130 of the adjacent pair of electric patterns 200 may extend in a second direction (e.g., opposite Y-direction), and the second dummy traces 140 of the adjacent pair of electric patterns 200 may extend in opposite directions and face away from one another (e.g., X-direction and opposite X-direction).

Referring to FIG. 7D, each of the electric patterns 200 may further include a second connection line 175 electrically connecting the first dummy trace 130 to the second dummy trace 140. Accordingly, even if there is a failure of the electrical trace 120, at least one of the first dummy trace 130 or the second dummy trace 140 may serve as an electrical trace. For example, if the electrical trace 120 is disconnected or electrically separated from the solder pad 110, an electrical signal can be transmitted from the electrical trace 120 to the solder pad 110 through the first dummy trace 130 via the first connection line 165 or through the second dummy trace 140 via the second connection line 175.

Figure 8A:
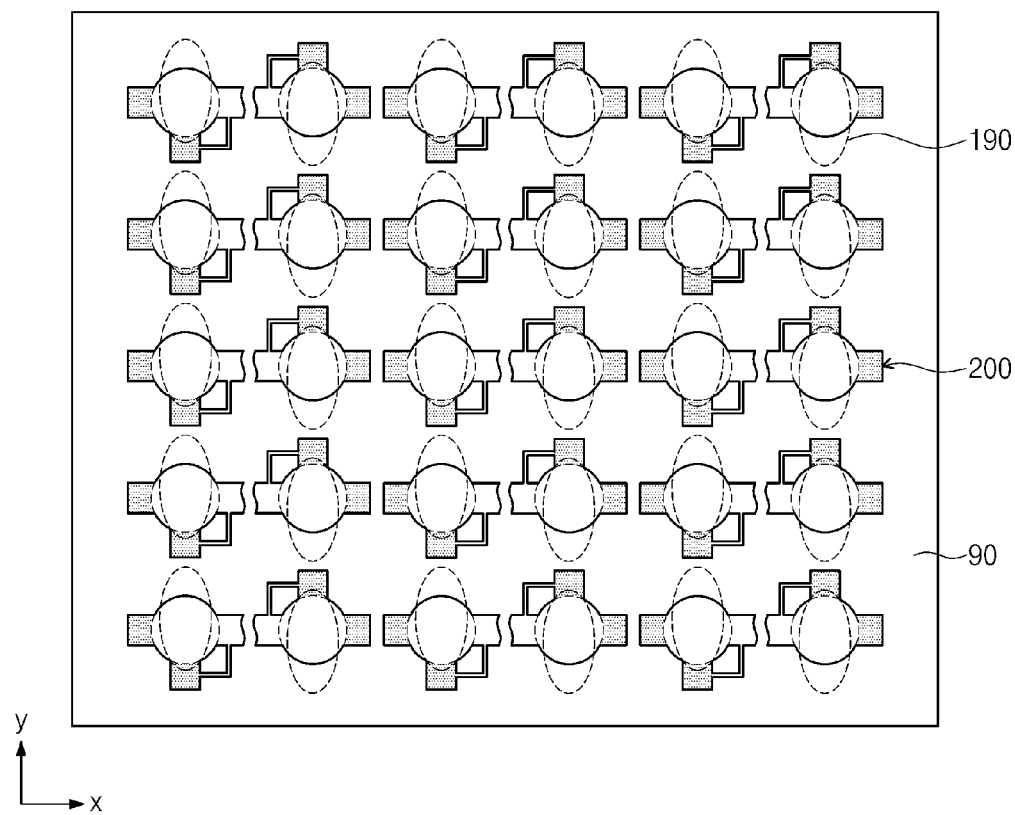
FIG. 8A is a plan view illustrating an electric apparatus, according to certain example embodiments.
Figure 8B:
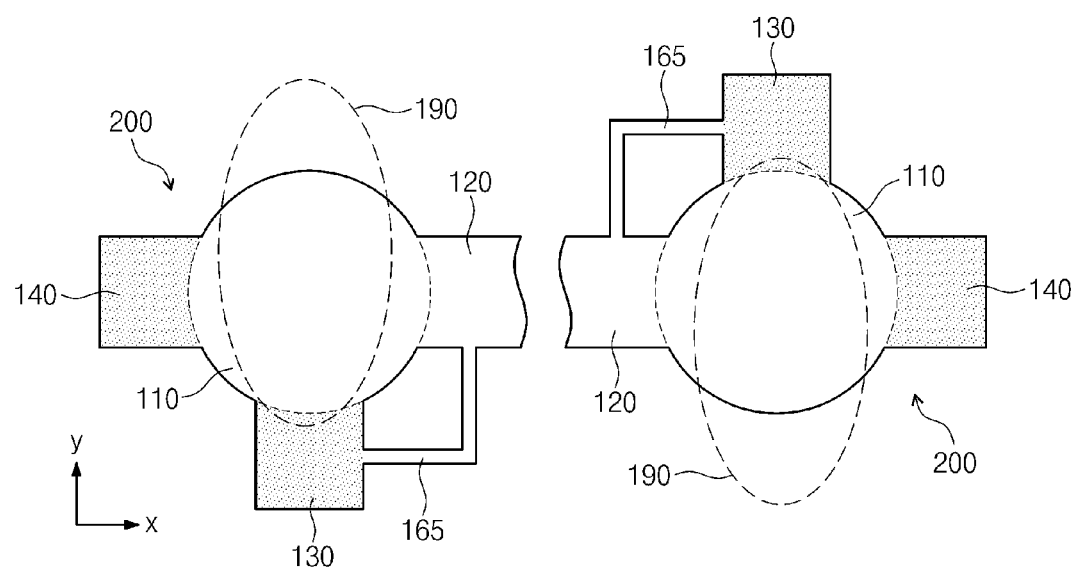
FIG. 8B is a plan view illustrating an arrangement of electric patterns provided in an electric apparatus, according to certain example embodiments.

FIG. 8A is a plan view illustrating an electric apparatus according to certain example embodiments. FIG. 8B is a plan view illustrating an arrangement of electric patterns provided in an electric apparatus according to certain example embodiments.

Referring to FIGS. 8A and 8B, an electric apparatus 3 may include a plurality of electric patterns 200, which may be regularly or randomly arranged on the substrate 90, as shown in FIG. 7A, for example. In the example of FIG. 8A, the electric patterns 200 are regularly spaced in rows and columns extending in the X and Y directions respectively, throughout a rectangular region having borders extending in the X and Y directions (as shown). FIGS. 8A and 8B illustrate two adjacent electric patterns 200 (i.e., adjacent pair of electric patterns 200). Each adjacent pair of the electric patterns 200 may be arranged to have symmetry (e.g., rotational symmetry or point symmetry). For example, in an adjacent pair of the electric patterns 200, the electrical traces 120 of each of the electric patterns 200 may be provided to face or mirror each other along a common axis (e.g., X-axis), the first dummy traces 130 may be oriented toward respective upward and downward directions (e.g., Y-direction and opposite Y-direction, respectively), and the second dummy traces 140 may be oriented toward respective left and right directions (e.g., opposite X-direction and X-direction, respectively). For instance, as illustrated in FIG. 8B, electrical traces 120 of the adjacent pair of electric patterns 200 may extend in opposite directions and face toward one another (e.g., X-direction and opposite X-direction), the first dummy traces 130 of the adjacent pair of electric patterns 200 may extend in a opposite direction and face away from one another (e.g., Y-direction and opposite Y-direction), and the second dummy traces 140 of the adjacent pair of electric patterns 200 may extend in mirroring directions (e.g., opposite X-direction and X-direction). In this case, each of the solder balls 190 may have a shape elongated toward the upward or downward direction (e.g., Y-direction or opposite Y-direction). For example, a first one of the adjacent pair of electric patterns 200 may have a solder ball 190 having a shape elongated toward the upward direction (e.g., Y-direction), and a second one of the adjacent pair of electric patterns 200 may have a solder ball 190 having a shape elongated toward the opposite or downward direction (e.g., opposite Y-direction).

Figure 9A:
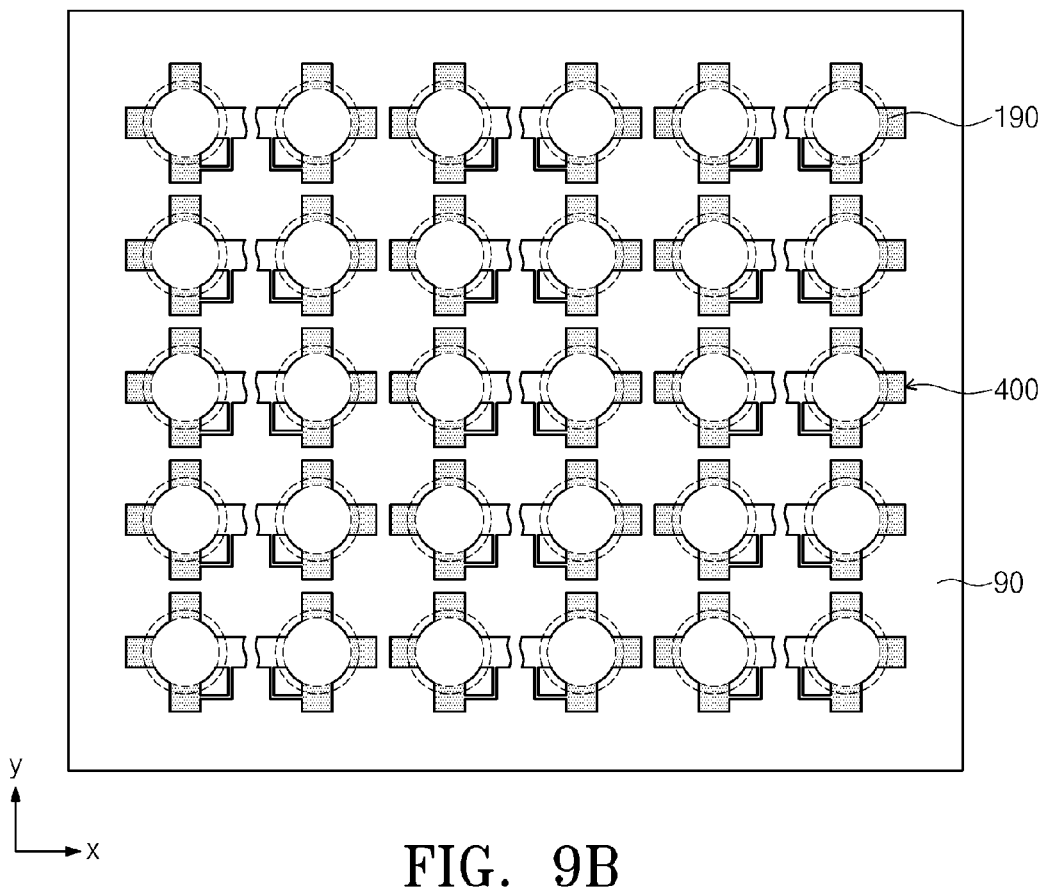
FIG. 9A is a plan view illustrating an electric apparatus, according to certain example embodiments.
Figure 9B:
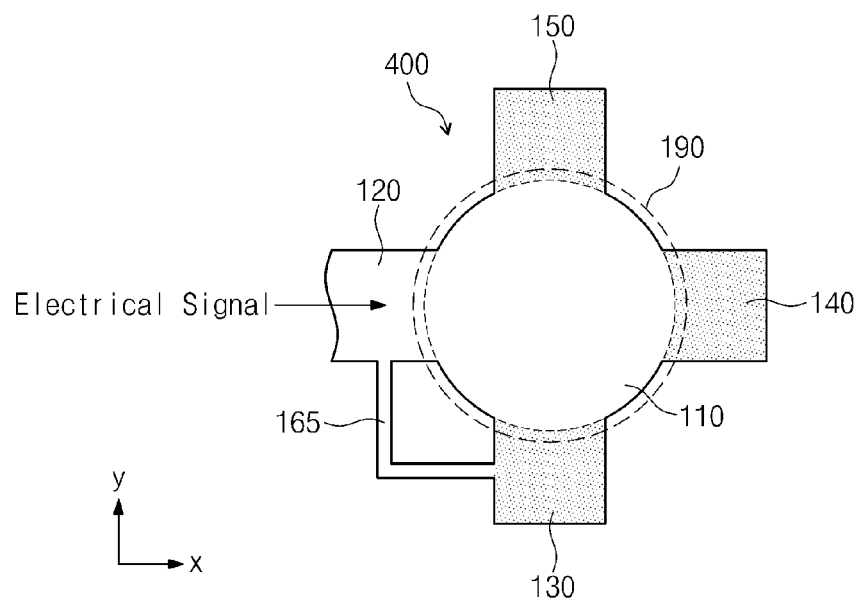
FIG. 9B is a plan view illustrating electric patterns provided in an electric apparatus, according to certain example embodiments.
Figure 9C:
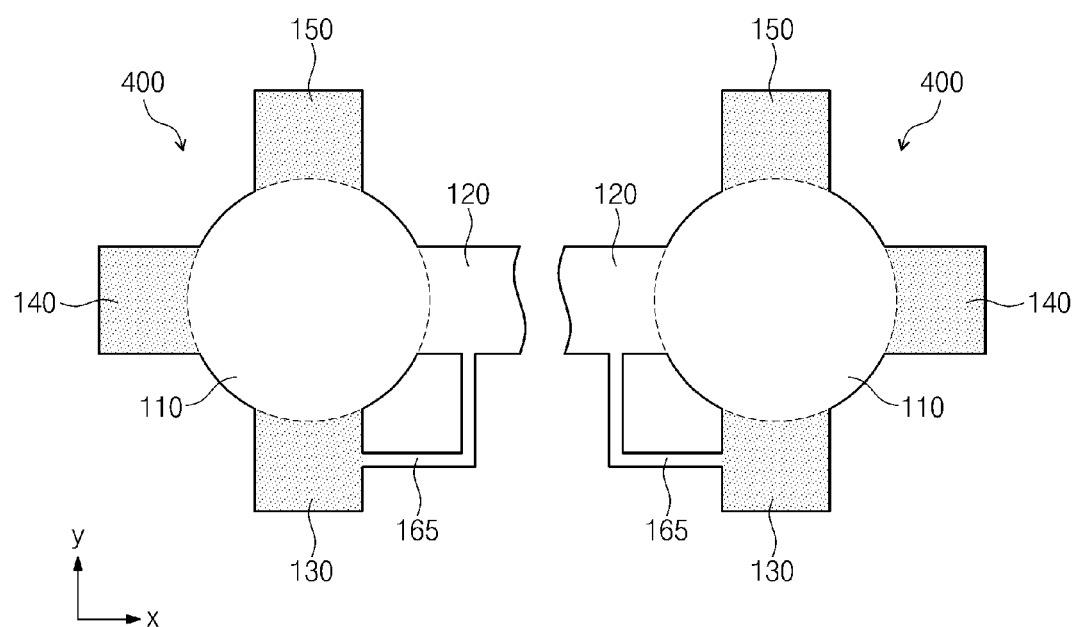
FIG. 9C is a plan view illustrating an arrangement of electric patterns provided in an electric apparatus, according to certain example embodiments.
Figure 9D:
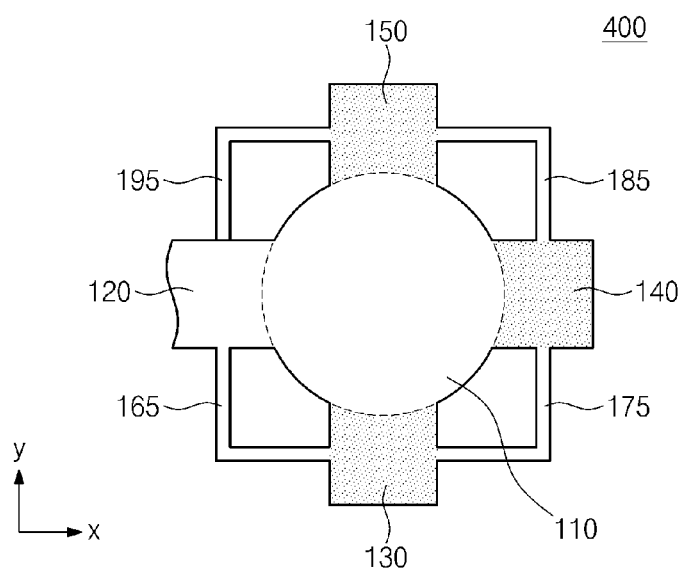
FIG. 9D is a plan view illustrating a modification of the disclosure of FIG. 9B, according to certain exemplary embodiments.

FIG. 9A is a plan view illustrating an electric apparatus according to certain example embodiments. FIG. 9B is a plan view illustrating electric patterns provided in an electric apparatus according to certain example embodiments. FIG. 9C is a plan view illustrating an arrangement of electric patterns provided in an electric apparatus according to certain example embodiments. FIG. 9D is a plan view illustrating a variation of the example embodiments shown in FIG. 9B.

Referring to FIG. 9A, an electric apparatus 4 may include a plurality of electric patterns 400 regularly or randomly arranged on the substrate 90. In the example of FIG. 9A, the plurality of electric patterns 200 are regularly spaced in rows and columns respectively extending in the X- and Y-directions throughout a region having borders extending in the X- and Y-directions. Each of the electric patterns 400 may be a bonding pad to which the solder ball 190 is connected. The electric patterns 400 may be arranged on the entire region or a local region of the substrate 90.

Referring to FIG. 9B, the electric pattern 400 may include a solder pad 110 to which the solder ball 190 is connected, an electrical trace 120 which extends laterally from a portion of the solder pad 110 in a first direction (e.g., opposite X-direction), and three dummy traces 130, 140, and 150 which extend laterally from other portions of the solder pad 110 second, third, and fourth directions (e.g., opposite Y-direction, X-direction, and Y-direction, respectively). The electrical trace 120 and the dummy traces 130, 140, and 150 may be provided to be perpendicular to one other and thereby to form right angles. For example, as illustrated in FIG. 9B, the electrical trace 120 may extend in the first direction (e.g., opposite X-direction), the first dummy trace 130 may extend in the second direction (e.g., opposite Y-direction), the second dummy trace 140 may extend in the third direction (e.g., X-direction), and the third dummy trace 150 may extend in the fourth direction (e.g., Y-direction). The electrical trace 120 and the first dummy trace 130 may be electrically connected to each other by the connection line 165. Thus, although not illustrated in FIG. 7B, if the electrical trace 120 is disconnected or electrically separated from the solder pad 110, an electrical signal can be transmitted from the electrical trace 120 to the solder pad 110 through the connection line 165 and the dummy trace 130.

FIG. 9C illustrates two adjacent electric patterns 400 (i.e., adjacent pair of electric patterns 400) of, for example, the electric apparatus 4 of FIG. 9A. Referring to FIG. 9C, at least one of the adjacent pairs of the electric patterns 400 may be arranged to have a symmetry (e.g., mirror symmetry). For example, in an adjacent pair of the electric patterns 400, the electrical traces 120 of each of the electric patterns 400 may be provided to face or mirror each other along a common axis (e.g., X-axis), the first dummy traces 130 of the electric patterns 400 may be oriented toward a downward direction (e.g., opposite Y-direction), the second dummy traces 140 of the electric patterns 400 may be oriented toward respective left and right directions (e.g., opposite X-direction and X-direction, respectively), and the third dummy traces 150 of the electric patterns 400 may be oriented toward the upward direction (e.g., X-direction). For instance, electrical traces 120 of the adjacent pair of electric patterns 400 may extend in opposite directions and face one another (e.g., X-direction and opposite X-direction), the first dummy traces 130 of the adjacent pair of electric patterns 400 may extend in a second direction (e.g., opposite Y-direction), the second dummy traces 140 of the adjacent pair of electric patterns 400 may extend in second and third directions that are opposite to and face away from one another (e.g., X-direction and opposite X-direction), and the third dummy traces 150 may extend in a fourth direction (e.g., Y-direction).

When a soldering process is performed in embodiments such as those disclosed in FIGS. 9A-9C, the electrical trace 120 and the dummy traces 130, 140, and 150 may suppress or prevent a liquefied solder ball from flowing laterally. For example, the combination of the electrical trace 120 and the dummy traces 130, 140, and 150 may cause a liquefied solder ball 190 to maintain a more circular or globular form, and impede the liquefied solder ball 190 from flowing or spreading and forming an elongated shape. Accordingly, as shown in FIG. 9A, it is possible to reduce to a minimum the risk of the bridge between the solder balls 190.

Referring to FIG. 9D, in some embodiments, the electric pattern 400 may further include a second connection line 175 electrically connecting the first dummy trace 130 with the second dummy trace 140, a third connection line 185 electrically connecting the second dummy trace 140 with the third dummy trace 150, and a fourth connection line 195 electrically connecting the third dummy trace 150 with the first electrical trace 120. Accordingly, even if there is a failure of the electrical trace 120, at least one of the first to third dummy traces 130 to 150 may serve as an electrical trace. For example, if the electrical trace 120 is disconnected or electrically separated from the solder pad 110, an electrical signal can be transmitted from the electrical trace 120 to the solder pad 110 through at least one of the first dummy trace 130 via the first connection line 165, the second dummy trace 140 via the second connection line 175, or the third dummy trace 150 via the third connection line 185 or the fourth connection line 195.

As discussed above in connection with FIG. 1B, other than by a possible connection to the electric trace 120 (e.g., by virtue of connection lines 165, 175, and/or 185), dummy traces 130, 140, and/or 150 may not be used to transmit an electrical signal between the solder pad 110 and another device. The only conductive elements the dummy traces 130, 140, and/or 150 may be directly connected to may comprise the solder pad 110 and a connection line (or lines) connecting the dummy traces 130, 140, and/or 150 to the electrical trace 120. In some examples, the solder pad 110 may be the only conductive element to which the dummy traces 130, 140, and/or 150 are directly connected.

FIGS. 10A through 10G are sectional views taken along line X-O-Y of example of FIG. 2 to illustrate a method of forming a solder mask layer, according to certain example embodiments.

Figure 10A:
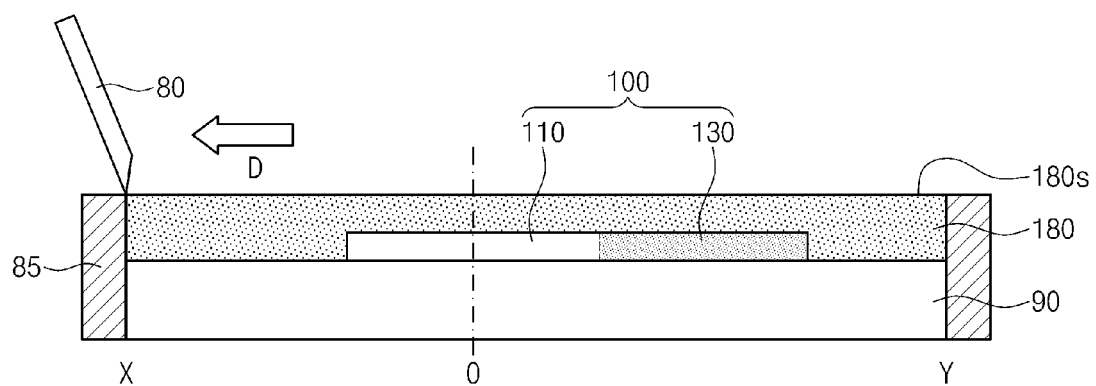
FIGS. 10A through 10G are sectional views taken along line X-O-Y of the exemplary embodiments of FIG. 2 to illustrate a method of forming a solder mask layer, according to certain example embodiments.

Referring to FIG. 10A, the solder mask layer 180 may be formed on the substrate 90 to cover the electric pattern 100. The solder mask layer 180 may be formed, for example, by a screen printing process, a stencil printing process, a curtain printing process, or a spray coating process. For instance, a screen printing process or a stencil printing process may be performed to form the solder mask layer 180 with a flat surface 180s, on the substrate 90. In the screen or stencil printing process, a stencil 85 may be used as a mask and a squeeze 80, which is configured to move along a direction D, may be used to perform a pressing and coating operation on a solder mask material. The solder mask layer 180 may include, for example, at least one of epoxy resins, acrylates, fillers, solvents, or insulating materials with additive agent.

The electric pattern 100 may include the solder pad 110 and the dummy trace 130. Also, although not illustrated in FIG. 10A, when viewed in a sectional view taken along line X-O-Z, the electric pattern 100 may include the solder pad 110 and the electrical trace 120, as shown in FIG. 3B. The dummy trace 130 may be substantially perpendicular to the electrical trace 120, as illustrated in FIG. 2.

Figure 10B:
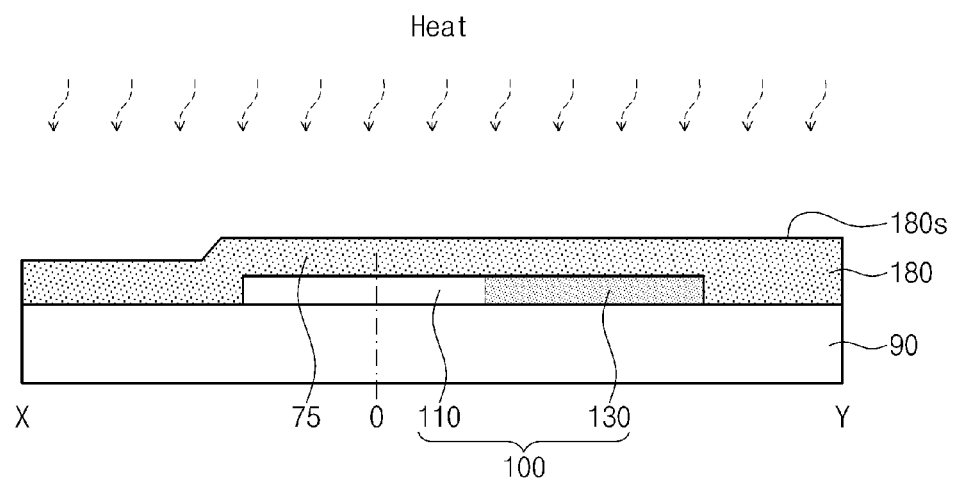

Referring to FIG. 10B, a first curing process may be performed to thermally treat the solder mask layer 180 at a relatively lower temperature (e.g., about 100 to about 130 degrees Celsius). As a result of the first curing process, a solvent may be removed from the solder mask layer 180. The removal of the solvent may allow the solder mask layer 180 to lose its adhesive characteristics, and thus, it may be possible to prevent the solder mask layer 180 from being attached to an exposure film 70 in a subsequent exposure process of FIG. 10C.

During the first curing process, the solder mask layer 180 may be shrunken to have an uneven surface that includes surface 180s. For example, a vertical level of the surface 180s of the solder mask layer 180 on the electric pattern 100 may be higher than that of other regions of the solder mask layer 180. In some embodiments, the solder mask layer 180 may be formed to have a non-exposure region 75, which is discussed in further detail below.

Figure 10C:
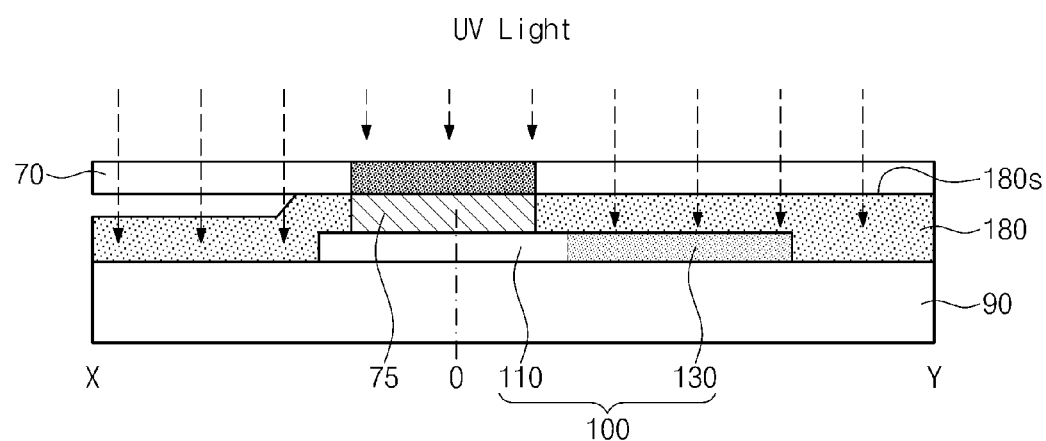

Referring to FIG. 10C, an exposure process may be performed when the exposure film 70 is attached to the surface 180s of the solder mask layer 180. In some embodiments, the exposure film 70 may serve as a mask in the exposure process. The exposure process may use ultraviolet light to selectively expose a portion of the solder mask layer 180. Since the exposure film 70 is used as the mask to the ultraviolet light, the solder mask layer 180 may be formed to have a non-exposure region 75. For example, the non-exposure region 75 may be formed in a portion of the solder mask layer 180 overlapped with the solder pad 110, when viewed in a plan view, as illustrated in FIG. 10C.

Figure 10D:
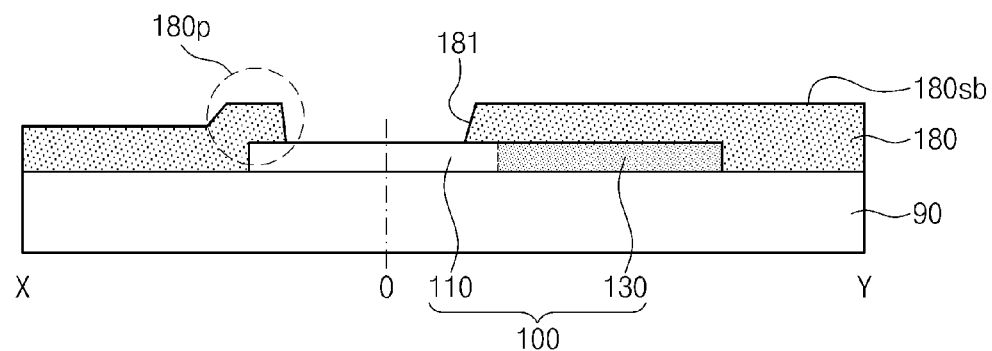

Referring to FIG. 10D, a developing solution may be supplied to the solder mask layer 180 to selectively remove the non-exposure region 75. As a result of the selective removal of the non-exposure region 75, the opening 181 may be formed to expose at least a portion of the solder pad 110. In some embodiments, a vertical level of the surface of the solder mask layer 180 may be high on the electric pattern 100 and low on other regions. For example, in the embodiment illustrated in FIG. 10D, the solder mask layer 180 may have include a surface 180sb may be positioned at a relatively higher level than other surfaces. Moreover, the solder mask layer 180 may be formed to have the protrusion 180p on or near an edge of the solder pad 110.

Figure 10E:
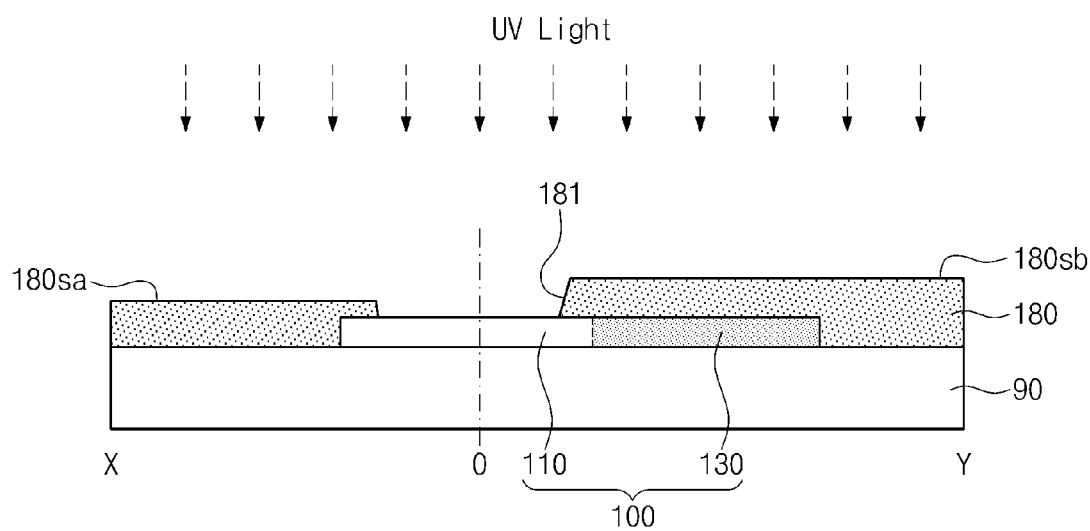

Referring to FIG. 10E, a second curing process may be performed to cure the solder mask layer 180 using, for example, ultraviolet light. As a result of the second curing process, some constituents of the solder mask layer 180 (e.g., epoxy resin) may be hardened, and thus, the solder mask layer 180 may have a resistant property to a subsequent marking process. For example, the solder mask layer 180 may be resistant to a subsequent marking process.

As a result of the second curing process, the solder mask layer 180 may be shrunken, and the surface 180s of the solder mask layer 180 may become flat. As a result of the shrinkage of the solder mask layer 180, the protrusion 180p of FIG. 10D may be merged into the solder mask layer 180, thereby vanishing at the solder mask layer 180. Thus, the solder mask layer 180 may have the first surface 180sa, which is positioned at a region spaced apart from the dummy trace 130, and the second surface 180sb, which is positioned at a region covering the electric pattern 100 and is higher than the first surface 180sa. For example, in the embodiment illustrated in FIG. 10E, the second surface 180sb may be formed to have a relatively higher surface level than that of the first surface 180sa.

Figure 10F:
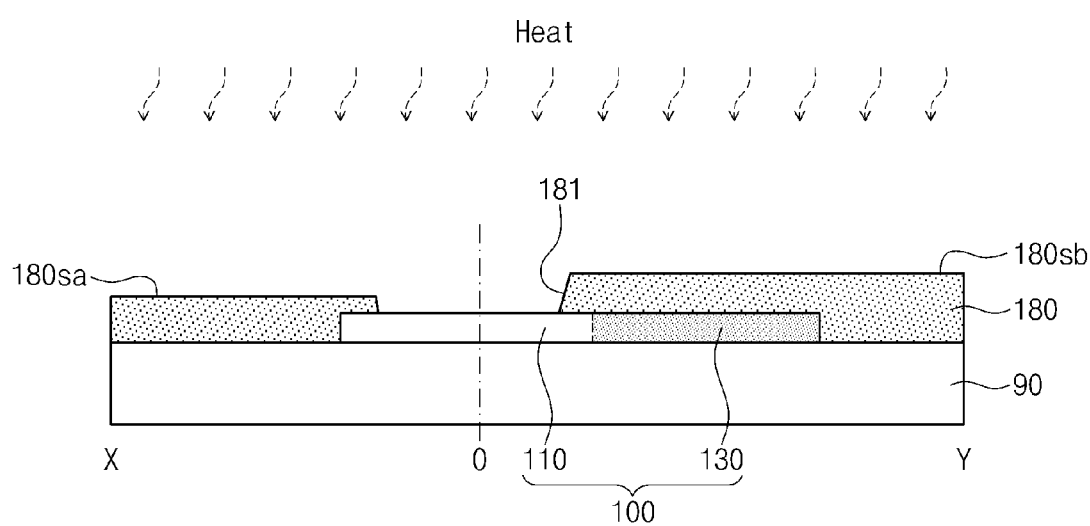

Referring to FIG. 10F, a final curing process may be performed at a relatively higher temperature (e.g., about 150 degrees Celsius or higher) to thermally cure the solder mask layer 180. The final curing process may be performed to dry out, or remove moisture from, the solder mask layer 180. In some embodiments, a difference in vertical surface levels between the first and second surfaces 180sa and 180sb of the solder mask layer 180 may be increased.

Figure 10G:
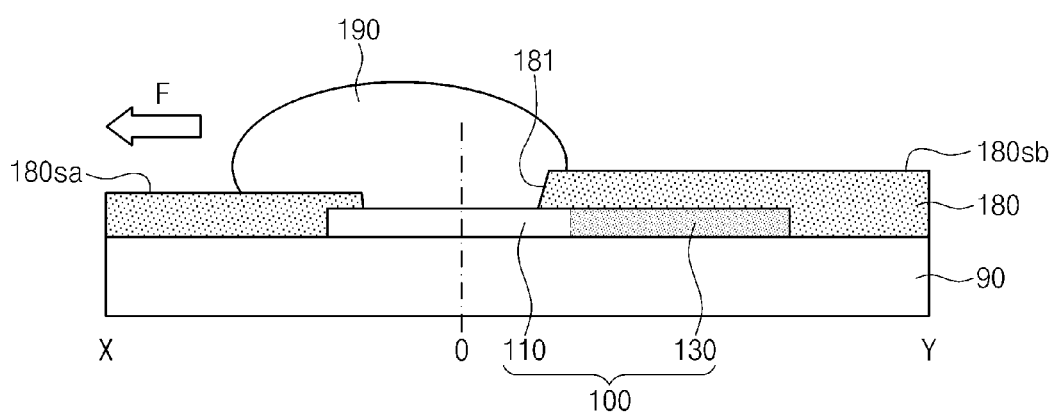

Referring to FIG. 10G, a liquid soldering material may be provided on the solder pad 110 that is exposed by the opening 181, and a reflow process may be performed to form the solder ball 190. When a soldering process is performed, the liquid soldering material may flow from the second surface 180sb toward the first surface 180sa having a lower vertical surface level (e.g., toward a region in which the dummy trace 130 and the electrical trace 120 are not formed, as shown in FIG. 2 or toward the direction F that is parallel to the line O-X). As a result of the anisotropic flow of the liquid soldering material, the solder ball 190 may be elongated toward the direction F parallel to the line O-X. For example, the shape of solder ball 190 may form an elliptical or elongated shape due to the gravitational flow of the liquid soldering material from the relatively higher second surface 180sb to the relatively lower first surface 180sa.

In some embodiments, the protrusion 180p of FIG. 10D may not be removed by the ultraviolet light curing process described with reference to FIG. 10E. In this case, as illustrated in the embodiments of FIGS. 4A and 4B, the solder mask layer 180 may be formed to have the first surface 180sa at a relatively lower level, the second surface 180sb at a relatively higher level, and the protrusion 180p adjacent to the edge of the solder pad 110.

Figure 11A:
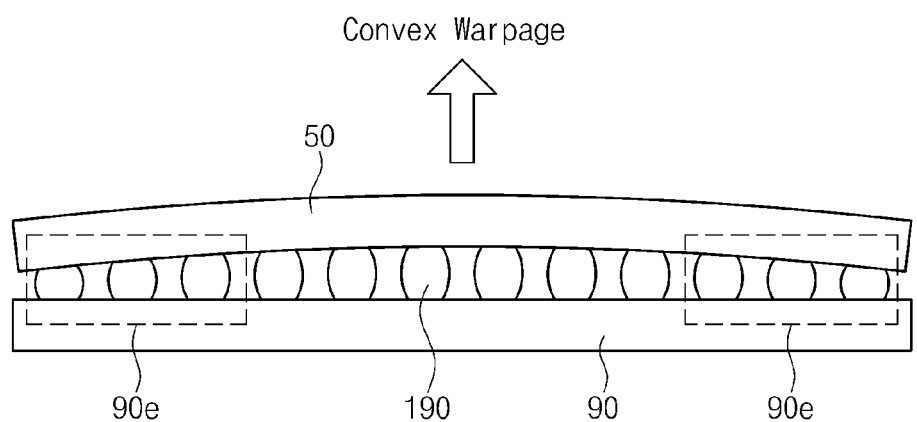
FIGS. 11A through 11C are sectional views illustrating semiconductor devices, in which an arrangement of electric patterns are used, consistent with certain example embodiments.
Figure 11B:
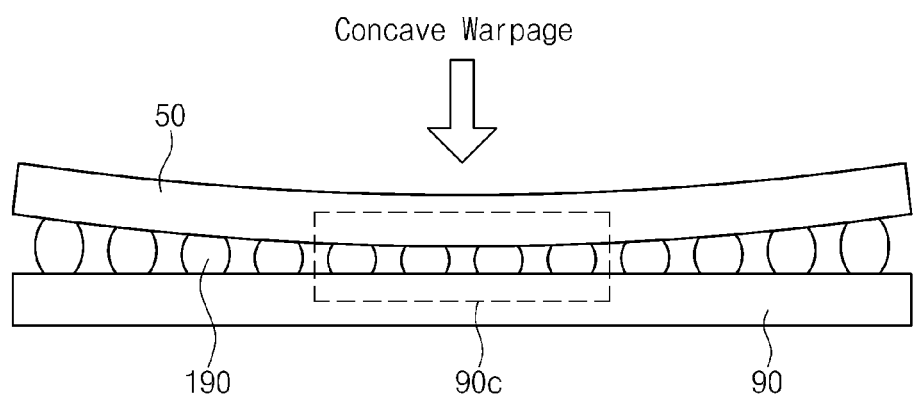
Figure 11C:
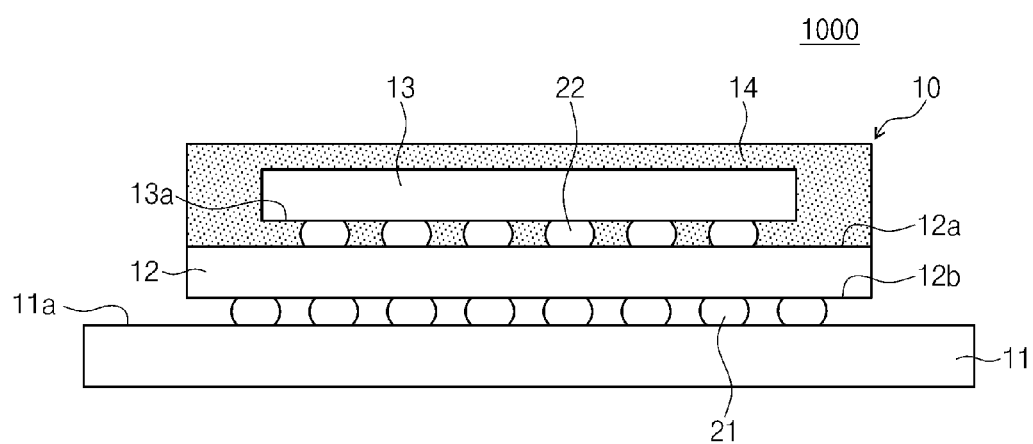

FIGS. 11A through 11C are sectional views illustrating semiconductor devices, in which an arrangement of electric patterns are used, according to certain example embodiments.

Referring to FIG. 11A, a semiconductor chip 50 may be mounted on the substrate 90, and the solder balls 190 may be used to electrically connect the substrate 90 to the semiconductor chip 50. Under a high temperature environment, the semiconductor chip 50 may be bent or warped to have an upwardly curved (i.e., convex) shape, illustrated in FIG. 11A with the upward-pointing arrow and labeled as "Convex Warpage." In this case, a bridge or "electrical short" between the solder balls 190 may happen near an edge region 90e of the substrate 90 (e.g., left and/or right edge regions 90e). In example embodiments, in order to prevent such a bridge between the solder balls 190, electric patterns provided near or on the edge regions 90e of the substrate 90 may be arranged to have the same arrangement as that of the electric patterns 100, 200, or 400. Moreover, the "Convex Warpage" may cause a break in the electrical connection between, for example, electrical trace 120 and solder pad 110 at or near the edge regions 90e. Thus, in certain embodiments, if the electrical traces 120 near or on the edge regions 90e of the substrate 90 are disconnected or electrically separated from the solder pad 110, electrical signals can be transmitted from the electrical trace 120 to the solder pad 110 through at least one of the first dummy trace 130 via the first connection line 165, the second dummy trace 140 via the second connection line 175, or the third dummy trace 150 via the third connection line 185 or the fourth connection line 195.

Referring to FIG. 11B, under a high temperature environment, the semiconductor chip 50 may be bent or warped to have a downwardly curved (i.e., concave) shape, illustrated in FIG. 11B with the downward-pointing arrow and labeled as "Concave Warpage." In this case, a bridge or "electrical short" between the solder balls 190 may happen near a center region 90c of the substrate 90. In example embodiments, in order to prevent such a bridge between the solder balls 190, electric patterns provided near or on the center region 90c of the substrate 90 may be arranged to have the same arrangement as that of the electric patterns 100, 200, or 400. Moreover, the "Concave Warpage" may cause a break in the electrical connection between, for example, electrical trace 120 and solder pad 110 at or near the center region 90c. Thus, in certain embodiments, if the electrical traces 120 near or on the center region 90c of the substrate 90 are disconnected or electrically separated from the solder pad 110, electrical signals can be transmitted from the electrical trace 120 to the solder pad 110 through at least one of the first dummy trace 130 via the first connection line 165, the second dummy trace 140 via the second connection line 175, or the third dummy trace 150 via the third connection line 185 or the fourth connection line 195.

Referring to FIG. 11C, a semiconductor device 1000 may include a board 11 and a semiconductor package 10 mounted on the board 11. The semiconductor package 10 may include a package substrate 12, a semiconductor chip 13 bonded on the package substrate 12 in a flip-chip bonding manner, for example, and a mold layer 14 encapsulating the semiconductor chip 13. The semiconductor chip 13 may be electrically connected to the package substrate 12 through solder balls 22, and the semiconductor package 10 may be electrically connected to the board 11 through solder balls 21.

In example embodiments, at least some of electric patterns and solder balls provided in the semiconductor device 1000 may be arranged to have the same arrangement as that of the electric patterns 100, 200, or 400 described herein and/or one or more of the related solder ball structures and solder ball arrangements as described herein. For example, at least one of the arrangements of the electric patterns 100, 200, and 400 may be applied to at least one of a top surface 11a of the board 11, top and bottom surfaces 12a and 12b of the package substrate 12, and a surface 13a of the semiconductor chip 13. The surface 13a of the semiconductor chip 13 may be an active surface.

According to example embodiments, a dummy trace may be provided at a side of a solder pad, and thus, it may be possible to control a flowing direction of a soldering material to a region, where the dummy trace is not provided. Accordingly, it is possible to prevent or suppress a solder bridge from occurring and thereby to realize a reliable electric apparatus. While example embodiments have been particularly shown and described, it will be understood by one of ordinary skill in the art that variations in form and detail may be made therein without departing from the spirit and scope of the attached claims.

What is claimed is:

1. An electric apparatus comprising:
a plurality of electric patterns arranged on a substrate, each of the electric patterns comprising:
a pad for connection with a solder ball;
an electrical trace laterally extending from a first portion of the pad and configured to communicate an electrical signal with the pad;
a first dummy trace laterally extending from a second portion of the pad; and
a first connection line formed between the first dummy trace and the electrical trace and configured to communicate the electrical signal between the first dummy trace and the electrical trace,
wherein the first dummy trace is offset from a straight line connecting the pad to the electrical trace,
wherein the first dummy trace extends from the pad in a first direction and the electrical trace extends from the pad in a second direction that forms a right angle with the first direction, and
wherein each of the electrical patterns comprises no more than two dummy traces.

2. The electric apparatus of claim 1, wherein each of the plurality of electric patterns further comprises a second dummy trace laterally extending from a third portion of the pad,
wherein the second dummy trace extends from the pad along first line,
wherein the electrical trace extends along the first line, and
wherein the pad is interposed between the second dummy trace and the electrical trace.

3. The electric apparatus of claim 2, wherein each of the plurality of electric patterns further comprises a second connection line configured to electrically connect the second dummy trace to the electrical trace.

4. The electric apparatus of claim 2, wherein the second dummy trace and the first dummy trace extend from the pad in directions that are at right angles to each other.

5. The electric apparatus of claim 1, further comprising:
a solder mask layer provided on the substrate covering a portion of each of the electric patterns and including openings, each opening exposing the pad of a corresponding one of the electric patterns,
wherein the solder mask layer comprises:
a first mask layer covering the electrical trace and the first dummy trace of each of the electric patterns; and
a second mask layer spaced apart from the electrical trace and the first dummy trace of each of the electric patterns,
wherein the first mask layer has a surface positioned at a higher level than a surface of the second mask layer.

6. The electric apparatus of claim 5, wherein the solder ball has a shape elongated toward the surface of the second mask layer.

7. The electric apparatus of claim 1, wherein an adjacent pair of the plurality of the electric patterns are provided in such a way that electrical traces thereof face each other and form a symmetric arrangement.

8. The electric apparatus of claim 7, wherein the adjacent pair of the plurality of the electric patterns are provided in such a way that first dummy traces thereof extend to opposite directions.

9. An electric apparatus, comprising:
a plurality of electric patterns provided on a substrate; and
a solder mask layer provided on the substrate covering the plurality of the electric patterns and including an opening exposing a portion of each of the plurality of the electric patterns,
wherein a first electric pattern of the plurality of electric patterns comprises:
a pad exposed by the opening and configured to connect to a solder ball;
an electrical trace laterally extending from a first portion of the pad and configured to communicate an electrical signal with the pad;
a first dummy trace laterally extending from a second portion of the pad; and
a first connection line formed between the first dummy trace and the electrical trace and configured to communicate the electrical signal with the pad,
wherein the first dummy trace is connected to the pad at a right angle with the electrical trace, and
wherein the electrical trace of the first electric pattern extends in a direction facing an electrical trace of a second electric pattern of the plurality of electric patterns.

10. The electric apparatus of claim 9, wherein the first dummy trace of the first electric pattern extends in a direction opposite to a first dummy trace of a second electric pattern of the plurality of the electric patterns.

11. The electric apparatus of claim 9, wherein the solder mask layer comprises:
a first mask layer formed to cover the electrical trace and the first dummy trace; and
a second mask layer formed to cover a portion of the pad and spaced apart from the electrical trace and the first dummy trace,
wherein the first mask layer has a surface higher than the second mask layer.

12. The electric apparatus of claim 9, wherein each of the electric patterns further comprises:
a second dummy trace laterally extending from a third portion of the pad, and
wherein the second dummy trace is provided opposite the electrical trace with the pad interposed therebetween and is configured to connect to the pad to form a right angle with the first dummy trace.

13. The electric apparatus of claim 12, wherein the first electric pattern further comprises:
a second connection line configured to electrically connect the first dummy trace to the second dummy trace.

14. The electric apparatus of claim 12, wherein the first electric pattern further comprises:
a third dummy trace laterally extending from a fourth portion of the pad, and
wherein the third dummy trace is provided opposite the first dummy trace with the pad interposed therebetween and is configured to connect to the pad to form a right angle with each of the electrical trace and the second dummy trace.

15. The electric apparatus of claim 14, wherein the first electric pattern further comprises:
at least one of a second connection line configured to electrically connect the first dummy trace to the second dummy trace, a third connection line configured to electrically connect the second dummy trace to the third dummy trace, or a fourth connection line configured to electrically connect the third dummy trace to the electrical trace.

16. An electric apparatus comprising:
a plurality of electric patterns arranged in rows and columns on a substrate, each of the electric patterns comprising:
a pad for connection with a solder ball, wherein the solder ball has a shape that, with respect to a top down view, is elongated;
an electrical trace laterally extending from a first portion of the pad and configured to communicate an electrical signal with the pad;
a first dummy trace laterally extending from a second portion of the pad;
a first connection line formed between the first dummy trace and the electrical trace and configured to communicate the electrical signal between the first dummy trace and the electrical trace;
a second dummy trace laterally extending from a third portion of the pad; and
a second connection line extending from the second dummy trace and configured to communicate the electrical signal between the electrical trace and the second dummy trace,
wherein a longitudinal axis of the solder ball having the elongated shape is at a 90° angle relative to at least one of the electrical trace, the first dummy trace, and the second dummy trace.

17. The electric apparatus of claim 16, wherein the second connection line is formed between the second dummy trace and the electrical trace and communicates the electrical signal between the second dummy trace and the electrical trace.

18. The electric apparatus of claim 16, wherein the second connection line is formed between the second dummy trace and the first dummy trace and communicates the electrical signal between the second dummy trace and the first dummy trace.

* * * * *